(12) United States Patent
Kim et al.

(10) Patent No.: US 9,277,233 B1
(45) Date of Patent: *Mar. 1, 2016

(54) PARAMETER UPDATE METHOD FOR ENTROPY CODING AND DECODING OF CONVERSION COEFFICIENT LEVEL, AND ENTROPY CODING DEVICE AND ENTROPY DECODING DEVICE OF CONVERSION COEFFICIENT LEVEL USING SAME

(71) Applicant: SAMSUNG ELECTRONICS CO., LTD., Gyeonggi-do (KR)

(72) Inventors: Chan-yul Kim, Bucheon-si (KR); Jae-hyun Kim, Seoul (KR); Jeong-hoon Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/603,171

(22) Filed: Jan. 22, 2015

Related U.S. Application Data

(63) Continuation of application No. 14/514,858, filed on Oct. 15, 2014, which is a continuation of application No. PCT/KR2013/003151, filed on Apr. 15, 2013.

(60) Provisional application No. 61/624,358, filed on Apr. 15, 2012.

(51) Int. Cl.
  *H04N 19/196* (2014.01)
  *H04N 19/122* (2014.01)
  (Continued)

(52) U.S. Cl.
  CPC ........... *H04N 19/196* (2014.11); *H04N 19/122* (2014.11); *H04N 19/136* (2014.11); *H04N 19/18* (2014.11); *H04N 19/60* (2014.11); *H04N 19/70* (2014.11); *H04N 19/91* (2014.11)

(58) Field of Classification Search
  CPC ............................... H04N 19/48; H04N 19/60
  USPC ..................................................... 375/240.18
  See application file for complete search history.

(56) References Cited

U.S. PATENT DOCUMENTS

| 8,350,735 | B2 | 1/2013 | Hallapuro et al. |
| 8,768,080 | B2 * | 7/2014 | He ............... H04N 19/50 382/232 |

(Continued)

FOREIGN PATENT DOCUMENTS

| KP | 10-2011-0044486 A | 4/2011 |
| KR | 10-2003-0083703 A | 10/2003 |

(Continued)

OTHER PUBLICATIONS

Communication dated Mar. 19, 2014, issued by the Korean Intellectual Property Office in counterpart Korean Application No. 10-2013-0041274.

(Continued)

*Primary Examiner* — William C Vaughn, Jr.
*Assistant Examiner* — Luis Perez Fuentes
(74) *Attorney, Agent, or Firm* — Sughrue Mion, PLLC

(57) ABSTRACT

Methods and apparatuses for decoding and encoding video are provided. A decoding apparatus includes a parser, a parameter determiner, and a syntax element restorer for obtaining current transformation coefficient level information by performing de-binarization of bit strings using a current binarization parameter, and generating a size of a current transformation coefficient using the current transformation coefficient level information.

1 Claim, 20 Drawing Sheets

(51) Int. Cl.
*H04N 19/18* (2014.01)
*H04N 19/60* (2014.01)
*H04N 19/70* (2014.01)
*H04N 19/91* (2014.01)
*H04N 19/136* (2014.01)

(56) References Cited

U.S. PATENT DOCUMENTS

| | | | | |
|---|---|---|---|---|
| 8,907,823 | B2 * | 12/2014 | Marpe | H03M 7/4006 341/107 |
| 8,947,273 | B2 * | 2/2015 | Bartnik | H03M 7/40 341/107 |
| 2005/0100233 | A1 | 5/2005 | Kajiki et al. | |
| 2006/0133479 | A1 | 6/2006 | Chen et al. | |
| 2007/0217703 | A1 | 9/2007 | Kajiwara | |
| 2009/0102859 | A1 | 4/2009 | Athsani et al. | |
| 2010/0295712 | A1 | 11/2010 | Hallapuro et al. | |
| 2010/0322307 | A1 | 12/2010 | Thyagarajan | |
| 2012/0082212 | A1 * | 4/2012 | Sadafale et al. | 375/240.2 |
| 2012/0230422 | A1 * | 9/2012 | Korodi | H04N 19/126 375/240.18 |
| 2013/0028326 | A1 * | 1/2013 | Moriya | H04N 19/176 375/240.16 |
| 2013/0272389 | A1 * | 10/2013 | Sze | H04N 19/00121 375/240.03 |
| 2014/0056360 | A1 | 2/2014 | Han et al. | |
| 2015/0030081 | A1 * | 1/2015 | Kim | H04N 19/91 375/240.18 |
| 2015/0146788 | A1 | 5/2015 | Han et al. | |

FOREIGN PATENT DOCUMENTS

| | | |
|---|---|---|
| KR | 10-2006-0072070 A | 6/2006 |
| KR | 10-2007-0094571 A | 9/2007 |
| KR | 10-2011-0044486 A | 4/2011 |
| KR | 10-1089725 B1 | 12/2011 |
| KR | 10-2012-0018360 A | 3/2012 |

OTHER PUBLICATIONS

Lou, et al.; "Improving coeff_abs_level_minus3 coding performance under high bitrate", Joint Collaborative Team on Video Coding (JCT-VE) of ITU-T SG16 WP3 and ISO/IEC/JTC1/SC29/WG11, 8th Meeting, San Jose, CA, Feb. 1-10, 2012, 11 pages total.
Search Report dated Jul. 31, 2013, issued by the International Searching Authority in counterpart International Application No. PCT/KR2013/003151.
Written Opinion dated Jul. 31, 2013, issued by the International Searching Authority in counterpart International Application No. PCT/KR2013/003151.
Communication dated Sep. 24, 2014, issued by the Korean Intellectual Property Office in counterpart Korean Application No. 10-2013-0041274.
Communication dated Jan. 2, 2015, issued by the Korean Intellectual Property Office in counterpart Korean Application No. 10-2014-0092160.
Communication dated Apr. 14, 2015 issued by the Korean Intellectual Property Office in counterpart Korean Patent Application No. 10-2015-0029111.
Communication dated Apr. 14, 2015 issued by the Korean Intellectual Property Office in counterpart Korean Patent Application No. 10-2015-0029110.
Communication dated Apr. 14, 2015 issued by the Korean Intellectual Property Office in counterpart Korean Patent Application No. 10-2015-0029109.
Communication dated May 22, 2015 issued by the Korean Intellectual Property Office in counterpart Korean Patent Application No. 10-2014-0092160.
Communication from the Australian Patent Office issued Oct. 26, 2015 in a counterpart Australian Application No. 2013250108.

* cited by examiner

CODING UNITS (1010)

FIG. 16

SigMap (1600)

| 1 | 1 | 1 | 1 |
|---|---|---|---|
| 1 | 1 | 1 | 1 |
| 1 | 1 | 1 | 0 |
| 1 | 1 | 1 | 0 |

FIG. 17 coeff_abs_level_greater1_flag (1700)

| 1 | 1 | 1 | 1 |
|---|---|---|---|
| 1 | 1 | 1 | 1 |
| 1 | 0 | 1 |   |
| 1 | 1 | 1 |   |

1710

FIG. 18 coeff_abs_level_greater2_flag (1800)

| 1 | 1 | 1 | 1 |
|---|---|---|---|
| 1 | 1 | 1 | 1 |
| 1 |   | 1 |   |
| 1 | 0 | 1 |   |

1810

FIG. 19 coeff_abs_level_remaining_flag (1900)

| 8 | 5 | 4 | 3 |
|---|---|---|---|
| 8 | 4 | 3 | 3 |
| 5 |   | 12 |   |
| 3 |   | 0 |   |

1910 1920                                1930

| 0 | 3 | 12 | 3 | 3 | 3 | 4 | 4 | 5 | 5 | 8 | 8 | cRiceParam=0   cRiceParam=1   cRiceParam=2

PARAMETER UPDATE METHOD FOR ENTROPY CODING AND DECODING OF CONVERSION COEFFICIENT LEVEL, AND ENTROPY CODING DEVICE AND ENTROPY DECODING DEVICE OF CONVERSION COEFFICIENT LEVEL USING SAME

CROSS-REFERENCE TO RELATED APPLICATION(S)

This application is a continuation application of U.S. patent application Ser. No. 14/514,858, filed on Oct. 15, 2014 in the U.S. Patent and Trademark Office, which is a continuation application of PCT International Application No. PCT/KR2013/003151, filed on Apr. 15, 2013, which claims the benefit of U.S. Provisional Application No. 61/624,358, filed on Apr. 15, 2012 in the United States Patent and Trademark Office, the entire disclosures of which are incorporated herein by reference.

BACKGROUND

1. Field

Methods and apparatuses consistent with exemplary embodiments relate to video encoding and decoding, and more particularly, to updating a parameter that is used in entropy encoding and decoding of size information of a transformation coefficient.

2. Description of Related Art

According to image compression methods such as Moving Picture Experts Group (MPEG)-1, MPEG-2, or MPEG-4 H.264/MPEG-4 advanced video coding (AVC), an image is split into blocks that have a predetermined size, and then, residual data of the blocks is obtained by inter prediction or intra prediction. Residual data is compressed by transformation, quantization, scanning, run length coding, and entropy coding. In entropy coding, a syntax element such as a transformation coefficient or a motion vector is entropy encoded and output as a bit stream. At a decoder's end, a syntax element is extracted from a bit stream, and decoding is performed based on the extracted syntax element.

SUMMARY

One or more exemplary embodiments provide a method of updating a parameter whereby an abrupt variation of a parameter used in entropy encoding and decoding of a transformation coefficient level is gradually changed while preventing an abrupt variation of the parameter.

One or more exemplary embodiments also provide a method of updating a parameter used in binarizing a syntax element such as a transformation coefficient level by using a binarization method such as a Golomb-Rice method or a concatenate code method.

One or more exemplary embodiments also provide a parameter updating method in which a parameter used in binarization of a transformation coefficient level is gradually updated.

According to one or more of the exemplary embodiments, by gradually varying a parameter used in entropy encoding of level information of a transformation coefficient, a bit amount generated during encoding may be reduced, and a gain of an image may be increased.

According to an aspect of an exemplary embodiment, there is provided a method of updating a parameter for entropy decoding of a transformation coefficient level. The method includes parsing transformation coefficient level syntax elements indicating sizes of transformation coefficients included in a transformation unit, from a bit stream, and determining whether to update a previous parameter by comparing a size of a previous transformation coefficient that is restored before a current transformation coefficient, with a predetermined critical value that is obtained based on the previous parameter that is used in de-binarization of a previous transformation coefficient level syntax element indicating the size of the previous transformation coefficient.

The method also includes obtaining a parameter used in de-binarization of a current transformation coefficient level syntax element indicating a size of the current transformation coefficient by updating or maintaining the previous parameter based on a result of the determining, and obtaining the size of the current transformation coefficient by de-binarizing the current transformation coefficient level syntax element using the obtained parameter, in which the predetermined critical value is set to have a value proportional to the previous parameter. When the previous parameter is changed, the changed parameter has a value that gradually increases compared to the previous parameter.

According to another aspect of another exemplary embodiment, there is provided an apparatus for entropy decoding a transformation coefficient level. The apparatus includes a parser that parses transformation coefficient level syntax elements indicating sizes of transformation coefficients included in a transformation unit, from a bit stream. The apparatus also includes a parameter determining unit that determines whether to update a previous parameter by comparing a size of a previous transformation coefficient that is restored before a current transformation coefficient, with a predetermined critical value that is obtained based on the previous parameter that is used in de-binarization of a previous transformation coefficient level syntax element indicating a size of the previous transformation coefficient, and that obtains a parameter used in de-binarization of a current transformation coefficient level syntax element indicating a size of the current transformation coefficient by updating or maintaining the previous parameter based on a result of the determination.

The apparatus also includes a syntax element restoring unit that obtains the size of the current transformation coefficient by de-binarizing the current transformation coefficient level syntax element by using the obtained parameter, wherein the predetermined critical value is set to have a value proportional to the previous parameter. When the previous parameter is updated, the updated parameter has a value that gradually increases compared to the previous parameter.

According to another aspect of another exemplary embodiment, there is provided a method of updating a parameter for entropy encoding of a transformation coefficient level. The method includes obtaining, in a predetermined scanning order, transformation coefficient level syntax elements indicating sizes of transformation coefficients included in a transformation unit, and determining whether to update a previous parameter by comparing a size of a previous transformation coefficient that is encoded before a current transformation coefficient, with a predetermined critical value. The predetermined critical value is obtained based on the previous parameter that is used in binarization of a previous transformation coefficient level syntax element indicating the size of the previous transformation coefficient.

The method also includes obtaining a parameter used in binarization of a current transformation coefficient level syntax element indicating a size of the current transformation coefficient by updating or maintaining the previous parameter based on a result of the determination, and outputting a bit string corresponding to a transformation coefficient level syntax element of the current transformation coefficient by binarizing the transformation coefficient level syntax element of the current transformation coefficient by using the obtained parameter, wherein the predetermined critical value is set to have a value proportional to the previous parameter. When the previous parameter is updated, the updated parameter has a value that gradually increases compared to the previous parameter.

According to another aspect of another exemplary embodiment, there is provided an apparatus for entropy encoding a transformation coefficient level. The apparatus includes a parameter determining unit that obtains, in a predetermined scanning order, transformation coefficient level syntax elements, determines whether to update a previous parameter by comparing a size of a previous transformation coefficient that is encoded before a current transformation coefficient, with a predetermined critical value obtained based on the previous parameter that is used in binarization of a previous transformation coefficient level syntax element indicating the size of the previous transformation coefficient, and obtains a parameter used in binarization of a current transformation coefficient level syntax element indicating a size of the current transformation coefficient by updating or maintaining the previous parameter based on a result of the determination. The apparatus also includes a bit string generating unit that outputs bit strings corresponding to the transformation coefficient level syntax element of the current transformation coefficient by binarizing the transformation coefficient level syntax elements of the current transformation coefficient by using the obtained parameter, wherein the predetermined critical value is set to have a value proportional to the previous parameter. When the previous parameter is updated, the updated parameter has a value that gradually increases compared to the previous parameter.

BRIEF DESCRIPTION OF THE DRAWINGS

The above and/or other aspects will become apparent and more readily appreciated from the following description of exemplary embodiments, taken in conjunction with the accompanying drawings in which:

FIG. 16 illustrates a significance map corresponding to the transformation unit of FIG. 15 according to an exemplary embodiment;

FIG. 17 illustrates coeff_abs_level_greater1_flag corresponding to the 4×4 transformation unit of FIG. 15;

FIG. 18 illustrates coeff_abs_level_greater2_flag corresponding to the 4×4 transformation unit of FIG. 15;

FIG. 19 illustrates coeff_abs_level_remaining corresponding to the 4×4 transformation unit of FIG. 15;

DETAILED DESCRIPTION

Hereinafter, methods and apparatuses for updating a parameter used in entropy encoding and decoding size information of a transformation unit according to exemplary embodiments are described with reference to FIGS. 1 through 13. In addition, a method of entropy encoding and decoding a syntax element obtained using the method of entropy encoding and decoding of a video described with reference to FIGS. 1 through 13 are described with reference to FIGS. 14 through 27. Expressions such as "at least one of," when preceding a list of elements, modify the entire list of elements and do not modify the individual elements of the list. Further, the apparatus elements described may be embodied as a hardware component, such as a processor or integrated circuit, and/or a software component that is executed by a hardware component such as a processor or computer.

Figure 1:
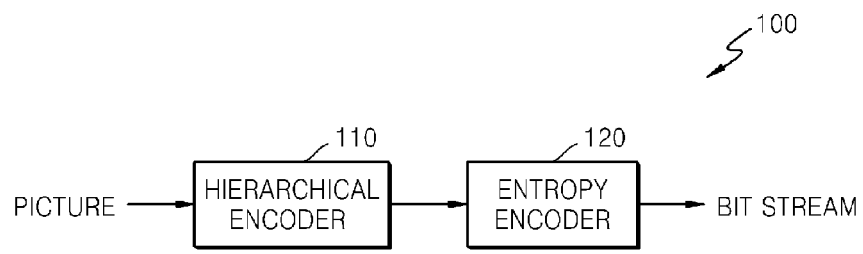
FIG. 1 is a block diagram of an apparatus for encoding video, according to an exemplary embodiment.

FIG. 1 is a block diagram of a video encoding apparatus 100 according to an exemplary embodiment.

Referring to FIG. 1, the video encoding apparatus 100 includes a hierarchical encoder 110 and an entropy encoder 120.

The hierarchical encoder 110 may split a current picture to be encoded, in units of predetermined data units to perform encoding on each of the data units. The hierarchical encoder 110 may split a current picture based on a maximum coding unit, which is a coding unit of a maximum size. The maximum coding unit may be a data unit having a size of 32×32, 64×64, 128×128, 256×256, and the like, and a shape of the data unit is a square which has width and length in squares of 2 and is greater than 8.

A coding unit may be characterized by a maximum size and a depth. The depth denotes the number of times the coding unit is spatially split from the maximum coding unit. As the depth deepens, deeper encoding units according to depths may be split from the maximum coding unit to a minimum coding unit. A depth of the maximum coding unit is an uppermost depth and a depth of the minimum coding unit is a lowermost depth. Because a size of a coding unit corresponding to each depth decreases as the depth of the maximum coding unit deepens, a coding unit corresponding to an upper depth may include a plurality of coding units corresponding to lower depths.

Image data of a current picture may be split into the maximum coding units according to a maximum size of the coding unit, and each of the maximum coding units may include deeper coding units that are split according to depths. Because the maximum coding unit is split according to depths, the image data of a spatial domain included in the maximum coding unit may be hierarchically classified according to depths.

A maximum depth and a maximum size of a coding unit, which are used to limit the total number of times a height and a width of the maximum coding unit are hierarchically split, may be predetermined.

The hierarchical encoder 110 encodes at least one split region that is obtained by splitting a region of the maximum coding unit according to depths, and determines a depth to output finally encoded image data according to the at least one split region. In other words, the hierarchical encoder 110 determines a coded depth by encoding the image data in the deeper coding units according to depths, based on a maximum coding unit of the current picture, and selecting a depth having the least encoding error. The determined coded depth and the encoded image data according to maximum encoding units are output to the entropy encoder 120.

The image data in the maximum coding unit is encoded based on the deeper coding units corresponding to a depth equal to or smaller than the maximum depth, and the results of encoding the image data are compared based on each of the deeper coding units. A depth having the least encoding error may be selected after comparing encoding errors of the deeper coding units. At least one coded depth may be selected for each maximum coding unit.

The size of the maximum coding unit is split as a coding unit is hierarchically split according to depths and as the number of coding units increases. Also, if coding units correspond to a same depth in one maximum coding unit, a determination may be made as to whether to split each of the coding units corresponding to the same depth to a lower depth by measuring an encoding error of the image data of each coding unit, separately. Accordingly, even when image data is included in one maximum coding unit, the image data is split into regions according to the depths, and the encoding errors may differ according to regions in the one maximum coding unit. Accordingly, the coded depths may differ according to regions in the image data. Thus, one or more coded depths may be determined in one maximum coding unit, and the image data of the maximum coding unit may be divided according to coding units of at least one coded depth.

The hierarchical encoder 110 may determine coding units having a tree structure included in the maximum coding unit. The coding units having a tree structure may include coding units corresponding to a depth determined to be the coded depth, from among all deeper coding units included in the maximum coding unit. A coding unit having a coded depth may be hierarchically determined according to depths in the same region of the maximum coding unit, and may be independently determined in different regions. Similarly, a coded depth in a current region may be independently determined from a coded depth in another region.

A maximum depth refers to an index related to the number of times splitting is performed from a maximum coding unit to a minimum coding unit. A first maximum depth may denote the total number of times splitting is performed from the maximum coding unit to the minimum coding unit. A second maximum depth may denote the total number of depth levels from the maximum coding unit to the minimum coding unit. For example, when a depth of the maximum coding unit is 0, a depth of a coding unit, in which the maximum coding unit is split once, may be set to 1, and a depth of a coding unit, in which the maximum coding unit is split twice, may be set to 2. Here, if the minimum coding unit is a coding unit in which the maximum coding unit is split four times, five depth levels of depths 0, 1, 2, 3, and 4 exist. Accordingly, the first maximum depth may be set to 4 and the second maximum depth may be set to 5.

Prediction encoding and transformation may be performed according to the maximum coding unit. The prediction encoding and the transformation may also be performed based on the deeper coding units according to a depth equal to or less than the maximum depth, according to the maximum coding unit.

Because the number of deeper coding units increases whenever the maximum coding unit is split according to depths, encoding including the prediction encoding and the transformation is performed on all of the deeper coding units generated as the depth deepens. For convenience of description, the prediction encoding and the transformation are described based on a coding unit of a current depth, in a maximum coding unit.

The video encoding apparatus 100 may variously select a size or shape of a data unit for encoding the image data. In order to encode the image data, operations such as prediction encoding, transformation, and entropy encoding, are performed. During these operations, the same data unit or different data units may be used for each operation.

For example, the video encoding apparatus 100 may select not only a coding unit for encoding the image data, but also a data unit that is different from the coding unit to perform the prediction encoding on the image data in the coding unit.

To perform prediction encoding in the maximum coding unit, the prediction encoding may be performed based on a coding unit corresponding to a coded depth, and the like, based on a coding unit that is no longer split into coding units corresponding to a lower depth. Hereinafter, the coding unit that is no longer split and becomes a basis unit for prediction encoding will be referred to as a prediction unit. A partition obtained by splitting the prediction unit may include a prediction unit or a data unit that is obtained by splitting at least one of a height and a width of the prediction unit.

For example, when a coding unit of 2N×2N (where N is a positive integer) is no longer split and becomes a prediction unit of 2N×2N, a size of a partition may be 2N×2N, 2N×N, N×2N, or N×N. Examples of a partition type include symmetrical partitions that are obtained by symmetrically splitting a height or width of the prediction unit, partitions that are obtained by asymmetrically splitting the height or width of the prediction unit, such as 1:n or n:1, partitions that are obtained by geometrically splitting the prediction unit, and partitions having arbitrary shapes.

A prediction mode of the prediction unit may be at least one of an intra mode, an inter mode, and a skip mode. For example, the intra mode or the inter mode may be performed on the partition of 2N×2N, 2N×N, N×2N, or N×N. Also, the skip mode may be performed only on the partition of 2N×2N. The encoding is independently performed on one prediction unit in a coding unit, thereby selecting a prediction mode having the least encoding error.

The video encoding apparatus 100 may also perform the transformation on the image data in a coding unit that is based not only on the coding unit for encoding the image data, but also based on a data unit that is different from the coding unit.

In order to perform the transformation in the coding unit, the transformation may be performed based on a data unit that has a size that is smaller than or equal to the coding unit. For example, the data unit for the transformation may include a data unit for an intra mode and a data unit for an inter mode.

A data unit used as a base of the transformation will be referred to herein as a 'transformation unit'. Similarly to the coding unit, the transformation unit in the coding unit may be recursively split into smaller sized regions, so that the transformation unit may be determined independently in units of regions. Thus, residual data in the coding unit may be divided according to the transformation unit having the tree structure according to transformation depths.

A transformation depth indicating the number of times splitting is performed to reach the transformation unit by splitting the height and width of the coding unit may also be set in the transformation unit. For example, in a current coding unit of 2N×2N, a transformation depth may be 0 when the size of a transformation unit is 2N×2N, it may be 1 when the size of a transformation unit is N×N, and may be 2 when the size of a transformation unit is N/2×N/2. The transformation unit having the tree structure may also be set according to transformation depths.

Encoding information according to coding units corresponding to a coded depth includes not only information about the coded depth, but also about information related to prediction encoding and transformation. Accordingly, the hierarchical encoder 110 not only determines a coded depth having the least encoding error, but also determines a partition type in a prediction unit, a prediction mode according to prediction units, and a size of a transformation unit for transformation.

Coding units according to a tree structure in a maximum coding unit and a method of determining a partition, according to exemplary embodiments are described with reference to FIGS. 3 through 12.

The hierarchical encoder 110 may measure an encoding error of deeper coding units according to depths using Rate-Distortion Optimization based on Lagrangian multipliers.

The entropy encoder 120 outputs the image data of the maximum coding unit and information about the encoding mode according to the coded depth, in bit streams. The image data of the maximum coding unit is encoded based on the at least one coded depth determined by the hierarchical encoder 110. The encoded image data may be a coding result of residual data of an image. The information about the encoding mode according to the coded depth may include information about the coded depth, information about the partition type in the prediction unit, prediction mode information, and size information of the transformation unit. When entropy encoding a syntax element indicating a size of a transformation unit, the entropy encoder 120 binarizes a syntax element indicating a size of a transformation unit according to bit strings using the parameter which is gradually updated. The operation of entropy encoding a transformation unit using the entropy encoding unit 120 is described later.

The information about the coded depth may be defined using split information according to depths, which indicates whether encoding is performed on coding units of a lower depth instead of a current depth. If the current depth of the current coding unit is the coded depth, image data in the current coding unit is encoded and output. For example, the split information may be defined not to split the current coding unit to a lower depth. Alternatively, if the current depth of the current coding unit is not the coded depth, the encoding is performed on the coding unit of the lower depth. Here, the split information may be defined to split the current coding unit to obtain the coding units of the lower depth.

If the current depth is not the coded depth, encoding is performed on the coding unit that is split into the coding unit of the lower depth. Because at least one coding unit of the lower depth exists in one coding unit of the current depth, the encoding is repeatedly performed on each coding unit of the lower depth. Thus, the encoding may be recursively performed for the coding units having the same depth.

Because the coding units having a tree structure are determined for one maximum coding unit, and information about at least one encoding mode is determined for a coding unit of a coded depth, information about at least one encoding mode may be determined for one maximum coding unit. Also, a coded depth of the image data of the maximum coding unit may be different according to locations because the image data is hierarchically split according to depths. Accordingly, information about the coded depth and the encoding mode may be set for the image data.

The entropy encoder 120 may assign encoding information about a corresponding coded depth and an encoding mode to at least one of the coding unit, the prediction unit, and a minimum unit included in the maximum coding unit.

The minimum unit is a square-shaped data unit obtained by splitting the minimum coding unit constituting the lowermost depth by 4. Alternatively, the minimum unit may be a maximum square-shaped data unit that is included in all of the coding units, prediction units, partition units, and transformation units included in the maximum coding unit.

For example, the encoding information output through the entropy encoder 120 may be classified into encoding information according to coding units and encoding information according to prediction units. The encoding information according to the coding units may include the information about the prediction mode and the size of the partitions. The encoding information according to the prediction units may include information about an estimated direction of an inter mode, a reference image index of the inter mode, a motion vector, a chroma component of an intra mode, and an interpolation method of the intra mode. The information about a maximum size of the coding unit defined according to pictures, slices, or a group of pictures (GOPs), and information about a maximum depth may be inserted into a header of a bit stream.

In the video encoding apparatus 100, the deeper coding unit may be a coding unit that is obtained by dividing a height or a width of a coding unit of an upper depth, which is a layer above, by two. In other words, when the size of the coding unit of the current depth is 2N×2N, the size of the coding unit of the lower depth is N×N. Also, the coding unit of the current depth having the size of 2N×2N may include a maximum number of four coding units of the lower depth.

Accordingly, the video encoding apparatus 100 may form the coding units in the tree structure by determining coding units having an optimum shape and an optimum size for each maximum coding unit, based on the size of the maximum coding unit and the maximum depth determined considering characteristics of the current picture. Also, because encoding may be performed on each maximum coding unit using any of various prediction modes and transformations, an optimum encoding mode may be determined considering characteristics of the coding unit of various image sizes.

Thus, if an image that has a high resolution or a large amount of data is encoded in a conventional macroblock, a number of macroblocks per picture excessively increases. As a result, a number of pieces of compressed information generated for each macroblock increases, and thus, it is difficult to transmit the compressed information and data compression efficiency decreases. However, using the video encoding apparatus 100, image compression efficiency may be increased because a coding unit is adjusted while considering characteristics of an image, while increasing a maximum size of a coding unit, and while considering a size of the image.

Figure 2:
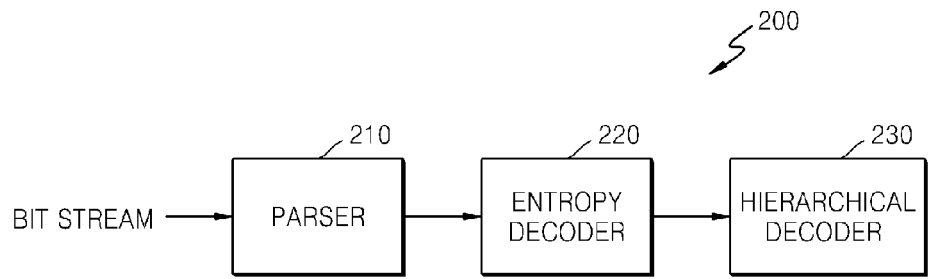
FIG. 2 is a block diagram of an apparatus for decoding video, according to an exemplary embodiment.

FIG. 2 is a block diagram of a video decoding apparatus 200 according to an exemplary embodiment.

Referring to FIG. 2, video decoding apparatus 200 includes a parser 210, an entropy decoder 220, and a hierarchical decoder 230. Definitions of various terms, such as coding unit, depth, prediction unit, transformation unit, and information about various encoding modes, for various operations of the video decoding apparatus 200 are the same as those described with reference to the video encoding apparatus 100 of FIG. 1.

In this example, the parser 210 receives a bit stream of an encoded video to parse a syntax element. The entropy decoder 220 extracts syntax elements indicating encoded image data based on coding units having a structure by performing entropy decoding of parsed syntax elements. The entropy decoder 220 outputs the extracted syntax elements to the hierarchical decoder 230. That is, the entropy decoder 220 performs entropy decoding of syntax elements that are received in the form of bit strings of 0 and 1, thereby restoring the syntax elements.

The entropy decoder 220 also extracts information about a coded depth, an encoding mode, color component information, prediction mode information, and the like, for the coding units that have a tree structure according to each maximum coding unit, from the parsed bitstream. The extracted information about the coded depth and the encoding mode is output to the hierarchical decoder 230. The image data in a bit stream is split into the maximum coding unit so that the hierarchical decoder 230 may decode the image data for each maximum coding unit.

The information about the coded depth and the encoding mode according to the maximum coding unit may be set for information about at least one coding unit corresponding to the coded depth. The information about an encoding mode may include information about a partition type of a corresponding coding unit corresponding to the coded depth, a prediction mode, and a size of a transformation unit. Also, splitting information according to depths may be extracted as the information about the coded depth.

The information about the coded depth and the encoding mode according to each maximum coding unit extracted by the entropy decoder 220 is information determined to generate a minimum encoding error when an encoder, such as the video encoding apparatus 100, repeatedly performs encoding for each deeper coding unit according to depths and according to each maximum coding unit. Accordingly, the video decoding apparatus 200 may restore an image by decoding the image data according to a coded depth and an encoding mode that generates the minimum encoding error.

The encoding information about the coded depth and the encoding mode may be assigned to a predetermined data unit from among a corresponding coding unit, a prediction unit, and a minimum unit. Accordingly, the entropy decoder 220 may extract the information about the coded depth and the encoding mode according to the predetermined data units. When information about a coded depth and encoding mode of a corresponding maximum coding unit is assigned to each of predetermined data units, the predetermined data units may be inferred to be the data units included in the same maximum coding unit.

The entropy decoder 220 de-binarizes a syntax element indicating a size of a transformation coefficient using a parameter that is gradually updated. An operation of obtaining size information of a transformation coefficient using the entropy decoder 220 by de-binarizing a bit string corresponding to a syntax element indicating a size of a transformation unit will be described later.

The hierarchical decoder 230 restores the current picture by decoding the image data in each maximum coding unit based on the information about the coded depth and the encoding mode according to the maximum coding units. In other words, the hierarchical decoder 230 may decode the encoded image data based on the extracted information about the partition type, the prediction mode, and the transformation unit for each coding unit from among the coding units having the tree structure included in each maximum coding unit. A decoding process may include prediction that includes intra prediction and motion compensation, and inverse transformation.

The hierarchical decoder 230 may perform intra prediction or motion compensation according to a partition and a prediction mode of each coding unit. For example, the hierarchical decoder 230 may perform the intra prediction or motion compensation based on the information about the partition type and the prediction mode of the prediction unit of the coding unit according to coded depths.

Also, the hierarchical decoder 230 may perform inverse transformation according to each transformation unit in the coding unit. For example, the hierarchical decoder 230 may perform the inverse transformation based on the information about the size of the transformation unit of the coding unit according to coded depths, so as to perform the inverse transformation according to maximum coding units.

The hierarchical decoder 230 may determine at least one coded depth of a current maximum coding unit using split information according to depths. If the split information indicates that image data is no longer split in the current depth, the current depth is a coded depth. Accordingly, the hierarchical decoder 230 may decode the coding unit of the current depth using the information about the partition type of the prediction unit, the prediction mode, and the size of the transformation unit.

In other words, data units containing the encoding information including the same split information may be gathered by observing the encoding information set assigned for the predetermined data unit from among the coding unit, the prediction unit, and the minimum unit. The gathered data units may be considered to be one data unit to be decoded by the hierarchical decoder 230 in the same encoding mode.

The video decoding apparatus 200 may obtain information about at least one coding unit that generates the minimum encoding error when encoding is recursively performed for each maximum coding unit. The video decoding apparatus 200 may use the information to decode the current picture. In other words, encoded image data of the coding units having the tree structure determined to be the optimum coding units in each maximum coding unit may be decoded.

Accordingly, even if image data has a high resolution and a large amount of data, the image data may be efficiently decoded and restored using a size of a coding unit and an encoding mode. The size of the coding unit and the encoding mode may be adaptively determined according to characteristics of the image data, using information about an optimum encoding mode received from an encoder.

A method of determining coding units having a tree structure, a prediction unit, and a transformation unit, according to an exemplary embodiment are described with reference to FIGS. 3 through 13.

Figure 3:
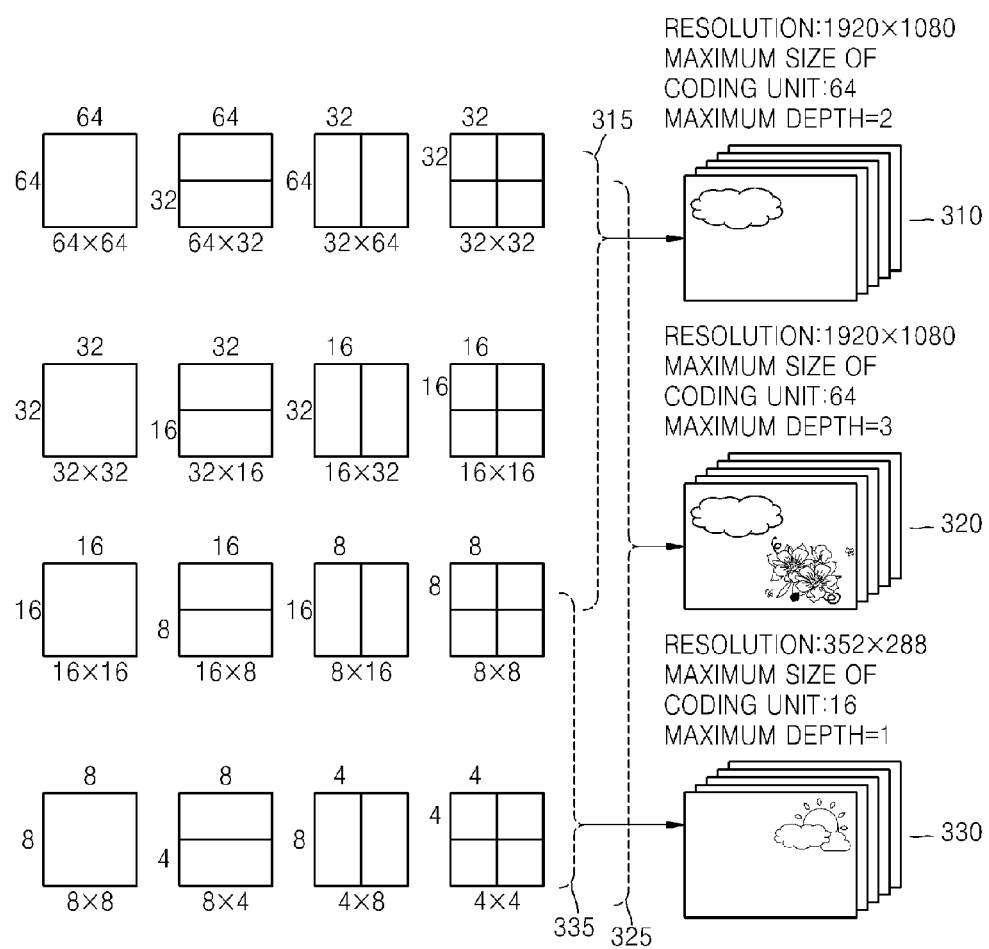
FIG. 3 is a diagram illustrating coding units according to an exemplary embodiment.

FIG. 3 is a diagram illustrating a concept of coding units according to an exemplary embodiment.

Referring to FIG. 3, a size of a coding unit may be expressed by a width×height, and may be 64×64, 32×32, 16×16, and 8×8. A coding unit of 64×64 may be split into partitions of 64×64, 64×32, 32×64, or 32×32. A coding unit of 32×32 may be split into partitions of 32×32, 32×16, 16×32, or 16×16. A coding unit of 16×16 may be split into partitions of 16×16, 16×8, 8×16, or 8×8. A coding unit of 8×8 may be split into partitions of 8×8, 8×4, 4×8, or 4×4.

Regarding video data 310 shown in FIG. 3, a resolution of 1920×1080, a maximum size of a coding unit of 64, and a maximum depth of 2 are set. Regarding video data 320, a resolution of 1920×1080, a maximum size of a coding unit of 64, and a maximum depth of 3 are set. Regarding video data 330, a resolution of 352×288, a maximum size of a coding unit of 16, and a maximum depth of 1 are set. The maximum depth shown in FIG. 3 denotes a total number of splits from a maximum coding unit to a minimum coding unit.

If a resolution is high or a data amount is large, a maximum size of a coding unit may be large to not only increase encoding efficiency but also to accurately reflect characteristics of an image. Accordingly, the maximum size of the coding unit of the video data in 310 and 320 that has a higher resolution than the video data 330, may be 64.

Because the maximum depth of the video data 310 is 2, coding units 315 of the video data 310 may include a maximum coding unit having a long axis size of 64, and coding units having long axis sizes of 32 and 16 because depths are deepened to two layers by splitting the maximum coding unit twice. Meanwhile, because the maximum depth of the video data 330 is 1, coding units 335 of the video data 330 may include a maximum coding unit having a long axis size of 16, and coding units having a long axis size of 8 because depths are deepened to one layer by splitting the maximum coding unit once.

The maximum depth of the video data 320 is 3. Here, coding units 325 of the video data 320 may include a maximum coding unit having a long axis size of 64, and coding units having long axis sizes of 32, 16, and 8 because the depths are deepened to 3 layers by splitting the maximum coding unit three times. As the depth deepens, detailed information may be precisely expressed.

Figure 4:
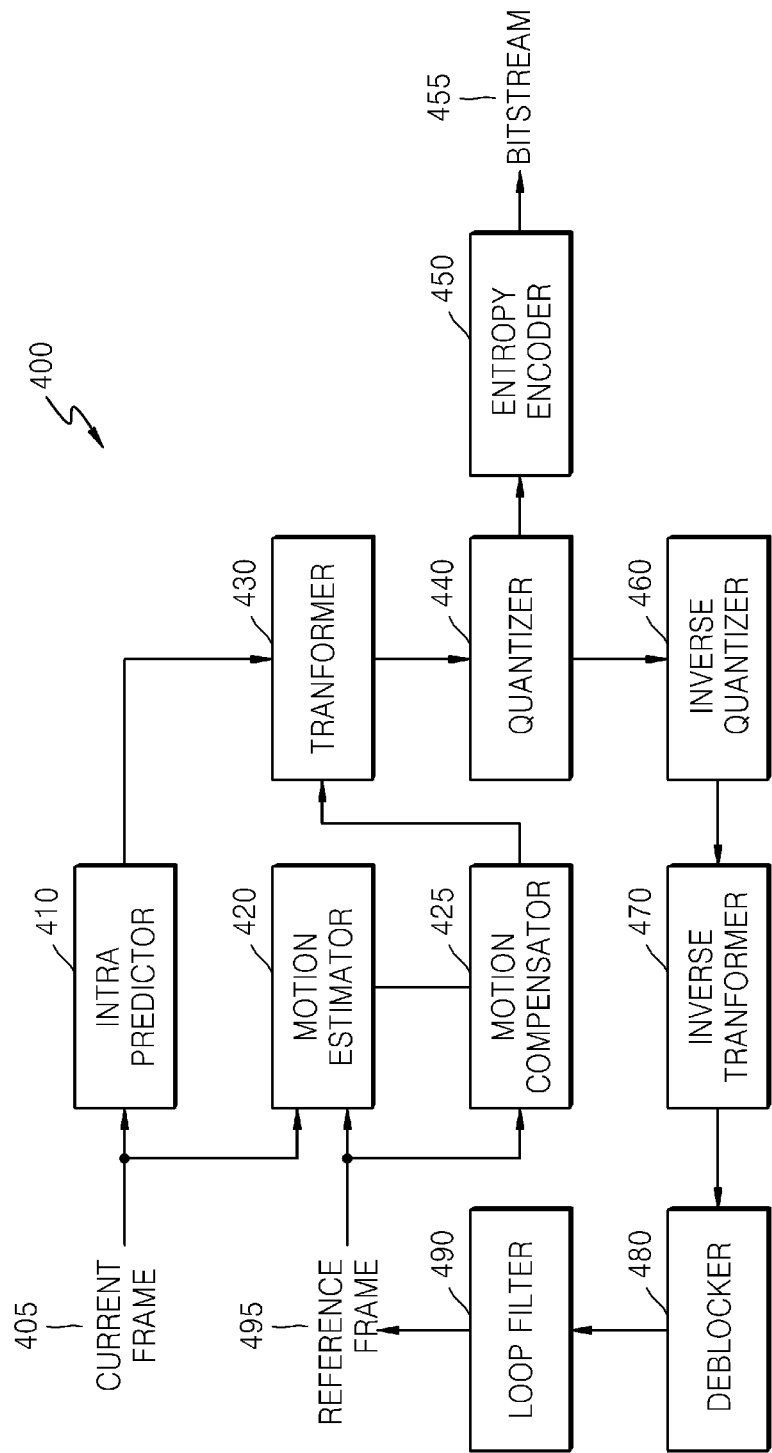
FIG. 4 is a block diagram of a video encoder based on coding units having a hierarchical structure, according to an exemplary embodiment.

FIG. 4 is a block diagram of a video encoder 400 based on coding units having a hierarchical structure, according to an exemplary embodiment.

Referring to the video encoder 400 of FIG. 4, an intra predictor 410 performs intra prediction on coding units in an intra mode, with respect to a current frame 405. A motion estimator 420 and a motion compensator 425 respectively perform inter estimation and motion compensation on coding units in an inter mode using the current frame 405 and a reference frame 495.

Data from the intra predictor 410, the motion estimator 420, and the motion compensator 425 is output as a quantized transformation coefficient through a transformer 430 and a quantizer 440. The quantized transformation coefficient is restored as data in a spatial domain through an inverse quantizer 460 and an inverse transformer 470. The restored data in the spatial domain is output as the reference frame 495 after being post-processed through a deblocker 480 and a loop filter 490. The quantized transformation coefficient may be output as a bitstream 455 through an entropy encoder 450.

The entropy encoder 450 arithmetically encodes syntax elements related to a transformation unit. The syntax elements includes a significance map indicating a position of a transformation unit that is not 0, a first critical value flag (coeff_abs_level_greater1_flag) indicating whether a transformation unit has a value greater than 1, a second critical value flag (coeff_abs_level_greather2_flag) indicating whether a transformation unit has a value greater than 2, and a size information of a transformation coefficient (coeff_abs_level_remaining) corresponding to a difference between a basic level (baseLevel) that is determined based on the first critical value flag and the second critical value flag and a real transformation coefficient (abscoeff).

In the video encoding apparatus 100, all elements of the video encoder 400, i.e., the intra predictor 410, the motion estimator 420, the motion compensator 425, the transformer 430, the quantizer 440, the entropy encoder 450, the inverse quantizer 460, the inverse transformer 470, the deblocker 480, and the loop filter 490, perform operations based on each coding unit from among coding units having a tree structure while considering the maximum depth of each maximum coding unit.

The intra predictor 410, the motion estimator 420, and the motion compensator 425 determine partitions and a prediction mode of each coding unit from among the coding units having a tree structure while considering the maximum size and the maximum depth of a current maximum coding unit. Also, the transformer 430 determines the size of the transformation unit in each coding unit from among the coding units having a tree structure.

Figure 5:
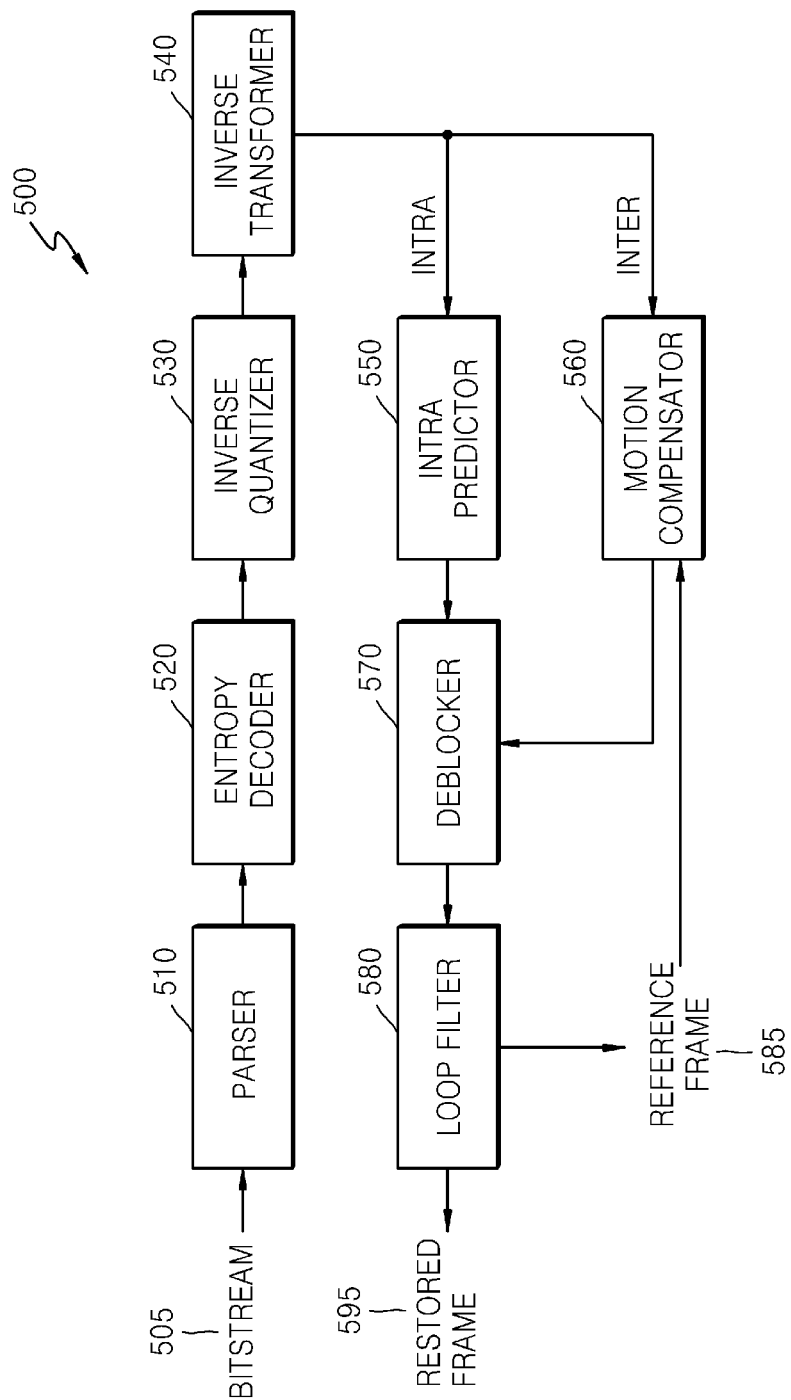
FIG. 5 is a block diagram of a video decoder based on coding units having a hierarchical structure, according to an exemplary embodiment.

FIG. 5 is a block diagram of a video decoder 500 based on coding units, according to an exemplary embodiment.

Referring to FIG. 5, a parser 510 parses encoded image data to be decoded and information about encoding for decoding, from a bitstream 505. The encoded image data passes through the entropy decoder 520 and the inverse quantizer 530 to be output as inversely quantized data. The entropy decoder 520 obtains elements related to a transformation unit from a bit stream. The elements may include a significance map indicating a position of a transformation unit that is not 0, a first critical value flag (coeff_abs_level_greater1_flag) indicating whether a transformation unit has a value greater than 1 or not, a second critical value flag (coeff_abs_level_greather2_flag) indicating whether a transformation unit has a value greater than 2, and size information of a transformation coefficient (coeff_abs_level_remaining) corresponding to a difference between a basic level (baseLevel) that is determined based on the first critical value flag and the second critical value flag and a real transformation coefficient (abscoeff). The entropy decoder 520 arithmetically decodes the obtained syntax elements to restore the syntax elements.

An inverse transformer 540 restores the inversely quantized data to image data in a spatial domain. An intra predictor 550 performs intra prediction on coding units in an intra mode with respect to the image data in the spatial domain, and a motion compensator 560 performs motion compensation on coding units in an inter mode using a reference frame 585.

The image data in the spatial domain, which has passed through at least one of the intra predictor 550 and the motion compensator 560, may be output as a restored frame 595 after being post-processed through a deblocker 570 and a loop filter 580. Also, the image data, which is post-processed through the deblocker 570 and the loop filter 580, may be output as the reference frame 585.

In the video decoding apparatus 200, all elements of the video decoder 500, i.e., the parser 510, the entropy decoder 520, the inverse quantizer 530, the inverse transformer 540, the intra predictor 550, the motion compensator 560, the deblocker 570, and the loop filter 580, perform operations based on coding units having a tree structure for each maximum coding unit.

The intra predictor 550 and the motion compensator 560 determine a partition and a prediction mode for each coding unit that has a tree structure, and the inverse transformer 540 determines a size of a transformation unit for each coding unit.

Figure 6:
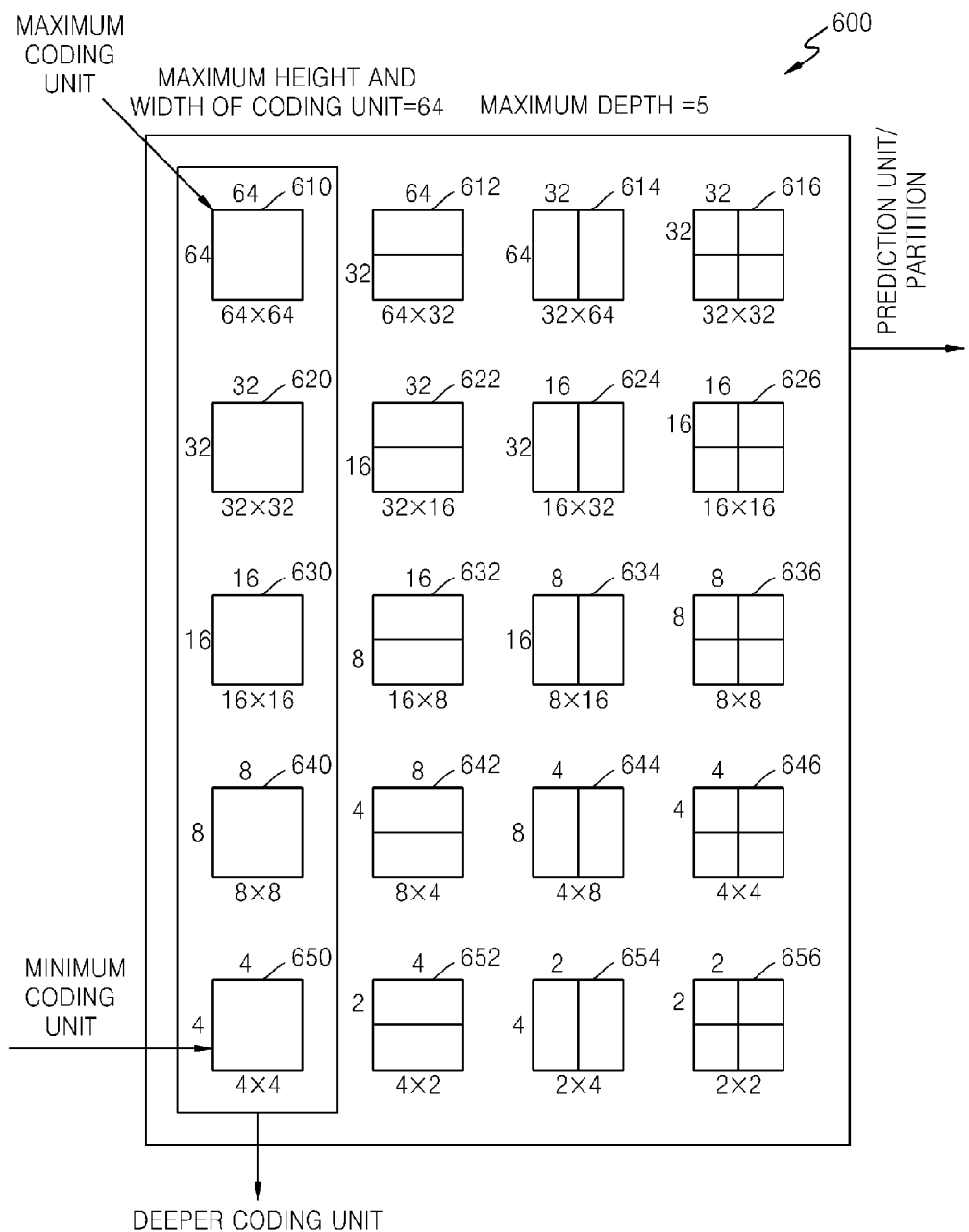
FIG. 6 is a diagram illustrating deeper coding units according to depths and partitions, according to an exemplary embodiment.

FIG. 6 is a diagram illustrating deeper coding units according to depths and partitions, according to an exemplary embodiment.

The video encoding apparatus 100 and the video decoding apparatus 200 use hierarchical coding units based on characteristics of an image. A maximum height, a maximum width, and a maximum depth of coding units may be adaptively determined according to the characteristics of the image, or may be set differently by a user. Sizes of deeper coding units may be determined according to the predetermined maximum size of the coding unit.

Referring to FIG. 6, in a hierarchical structure 600 of coding units, the maximum height and the maximum width of the coding units are each 64, and the maximum depth is 4. In this example, a depth deepens along a vertical axis of the hierarchical structure 600, a height and a width of the deeper coding unit are each split. Also, a prediction unit and partitions, which are bases for prediction encoding of each deeper coding unit, are shown along a horizontal axis of the hierarchical structure 600.

In other words, a coding unit 610 is a maximum coding unit in the hierarchical structure 600, in which a depth is 0 and a size, i.e., a height by width, is 64×64. The depth deepens along the vertical axis, and includes a coding unit 620 having a size of 32×32 and a depth of 1, a coding unit 630 having a size of 16×16 and a depth of 2, a coding unit 640 having a size of 8×8 and a depth of 3, and a coding unit 650 having a size of 4×4 and a depth of 4. The coding unit 650 having the size of 4×4 and the depth of 4 is a minimum coding unit among the coding units shown in FIG. 6.

The prediction unit and the partitions of a coding unit are arranged along the horizontal axis according to depth. In other words, if the coding unit 610 having the size of 64×64 and the depth of 0 is a prediction unit, the prediction unit may be split into partitions included in the encoding unit 610, for example, a partition 610 having a size of 64×64, partitions 612 having the size of 64×32, partitions 614 having the size of 32×64, or partitions 616 having the size of 32×32.

A prediction unit of the coding unit 620 having the size of 32×32 and a depth of 1 may be split into partitions included in the coding unit 620, for example, a partition 620 having a size of 32×32, partitions 622 having a size of 32×16, partitions 624 having a size of 16×32, and partitions 626 having a size of 16×16.

A prediction unit of the coding unit 630 having the size of 16×16 and a depth of 2 may be split into partitions included in the coding unit 630, for example, a partition having a size of 16×16 included in the coding unit 630, partitions 632 having a size of 16×8, partitions 634 having a size of 8×16, and partitions 636 having a size of 8×8.

A prediction unit of the coding unit 640 having the size of 8×8 and a depth of 3 may be split into partitions included in the coding unit 640, for example, a partition having a size of 8×8 included in the coding unit 640, partitions 642 having a size of 8×4, partitions 644 having a size of 4×8, and partitions 646 having a size of 4×4.

The coding unit 650 having the size of 4×4 and the depth of 4 in this example is the minimum coding unit and a coding unit of the lowermost depth. A prediction unit of the coding unit 650 is only assigned to a partition having a size of 4×4.

In order to determine the at least one coded depth of the coding units included in the maximum coding unit 610, the hierarchical encoder 110 of the video encoding apparatus 100 performs encoding for coding units corresponding to each depth included in the maximum coding unit 610.

The number of deeper coding units according to depths including data in the same range and the same size increases as the depth deepens. For example, four coding units corresponding to a depth of 2 are used to cover data that is included in one coding unit corresponding to a depth of 1. Accordingly, in order to compare encoding results of the same data according to depths, the coding unit corresponding to a depth of 1 and four coding units corresponding to a depth of 2 are each encoded.

To perform encoding for a current depth, a minimum encoding error may be selected for the current depth by performing encoding for each prediction unit in the coding units corresponding to the current depth, along the horizontal axis of the hierarchical structure 600. Alternatively, the minimum encoding error may be selected by comparing the least encoding errors according to depths and performing encoding for each depth as the depth deepens along the vertical axis of the hierarchical structure 600. A depth and a partition having the minimum encoding error in the maximum coding unit 610 may be selected as the coded depth and a partition type of the maximum coding unit 610.

Figure 7:
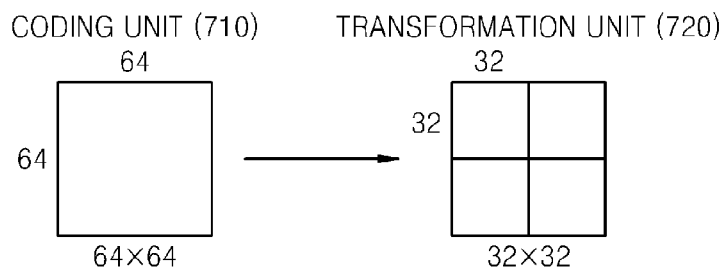
FIG. 7 is a diagram illustrating a relationship between a coding unit and transformation units, according to an exemplary embodiment.

FIG. 7 is a diagram illustrating a relationship between a coding unit 710 and transformation units 720, according to an exemplary embodiment.

The video encoding apparatus 100 of FIG. 1 or the video decoding apparatus 200 of FIG. 2 encodes or decodes an image according to coding units having sizes smaller than or equal to a maximum coding unit for each maximum coding unit. Sizes of transformation units for transformation during encoding may be selected based on data units that are smaller than a corresponding coding unit.

For example, referring to FIG. 7, if a size of the coding unit 710 is 64×64, transformation may be performed using the transformation units 720 having a size of 32×32.

Also, data of the coding unit 710 having the size of 64×64 may be encoded by performing the transformation on each of the transformation units having the size of 32×32, 16×16, 8×8, and 4×4, which are smaller than the coding unit having the size 64×64, and then a transformation unit having the least coding error may be selected.

Figure 8:
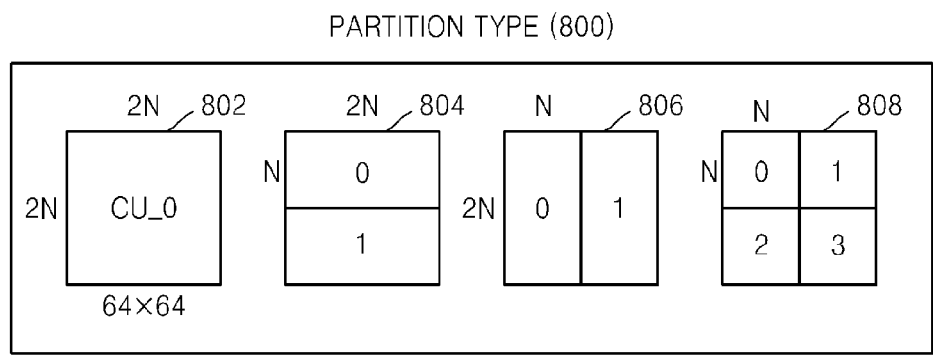
FIG. 8 is a diagram illustrating encoding information of coding units corresponding to a coded depth, according to an exemplary embodiment.
Figure 8:
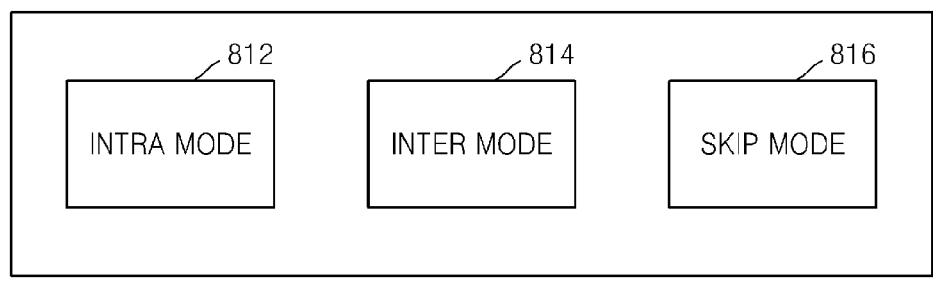
Figure 8:
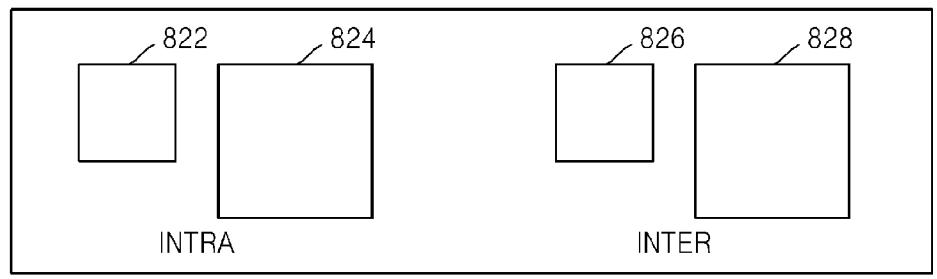

FIG. 8 is a diagram illustrating encoding information of coding units corresponding to a coded depth, according to an exemplary embodiment.

An output unit (not shown) of the video encoding apparatus 100 may encode and transmit information 800 about a partition type, information 810 about a prediction mode, and information 820 about a size of a transformation unit for each coding unit corresponding to a coded depth, and output the information as information about an encoding mode.

The information 800 indicates information about a shape of a partition obtained by splitting a prediction unit of a current coding unit. The partition is a data unit for prediction encoding the current coding unit. For example, a current coding unit CU_0 having a size of 2N×2N may be split into any one of a partition 802 having a size of 2N×2N, a partition 804 having a size of 2N×N, a partition 806 having a size of N×2N, a partition 808 having a size of N×N, and the like. Here, the information 800 about a partition type is set to indicate one of the partition 802 having a size of 2N×2N, the partition 804 having a size of 2N×N, the partition 806 having a size of N×2N, and the partition 808 having a size of N×N.

The information 810 indicates a prediction mode of each partition. For example, the information 810 may indicate a mode of prediction encoding that is performed on a partition indicated by the information 800, such as an intra mode 812, an inter mode 814, or a skip mode 816.

The size of transformation unit information 820 indicates a transformation unit based on when a transformation is performed on a current coding unit. For example, the transformation unit may be a first intra transformation unit 822, a second intra transformation unit 824, a first inter transformation unit 826, or a second inter transformation unit 828.

The image data and encoding data extracting unit 210 of the video decoding apparatus 200 shown in FIG. 2 may extract and use the information 800 information about coding units, the information 810 about a prediction mode, and the information 820 about a size of a transformation unit, for decoding, according to each deeper coding unit.

Figure 9:
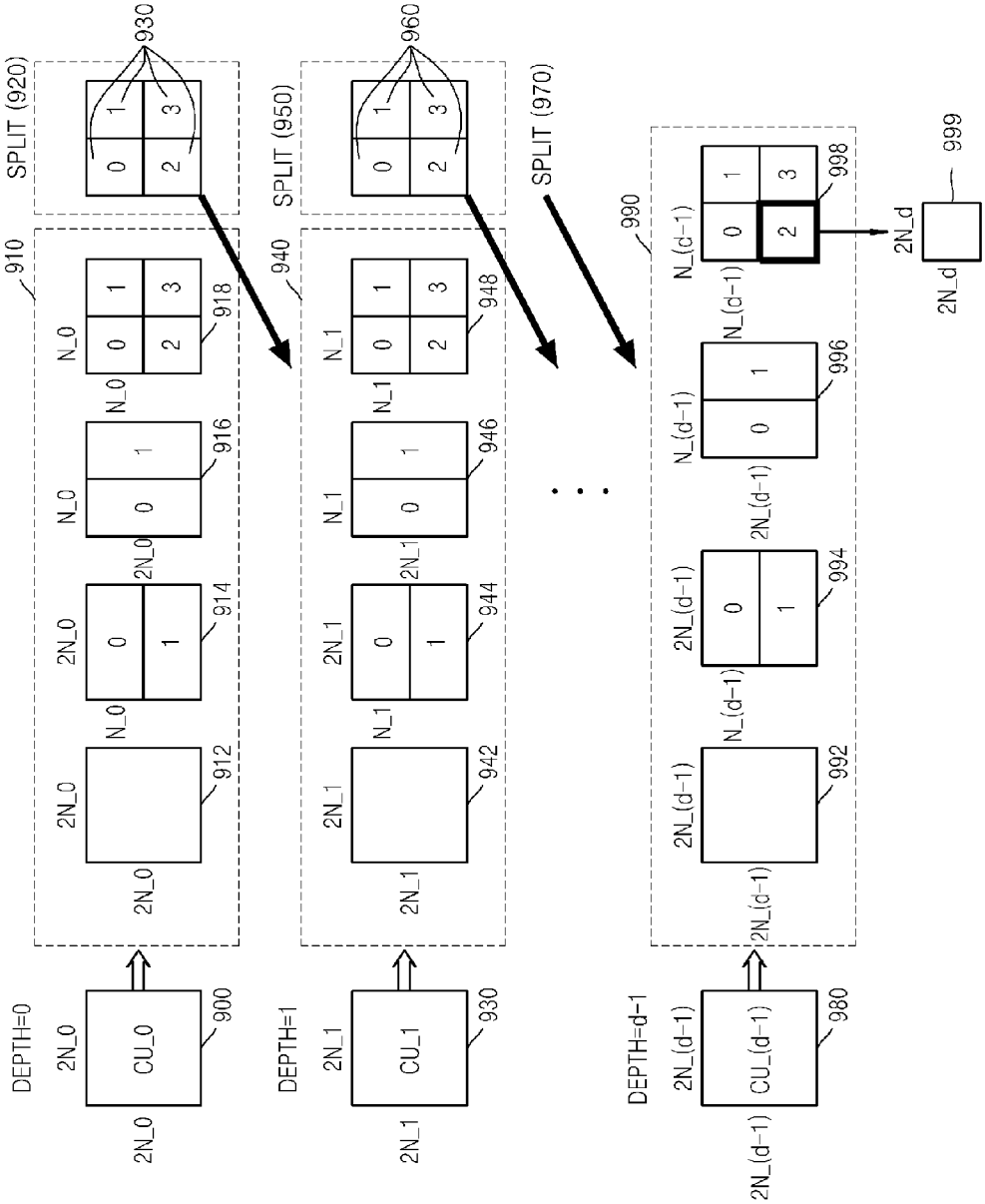
FIG. 9 is a diagram of deeper coding units according to depths, according to an exemplary embodiment.

FIG. 9 is a diagram of deeper coding units according to depths, according to an exemplary embodiment.

Referring to FIG. 9, split information may be used to indicate a change of depth. The spilt information indicates whether a coding unit of a current depth is split into coding units of a lower depth.

A prediction unit 910 for prediction encoding of a coding unit 900 having a depth of 0 and a size of 2N_0×2N_0 may include partitions of a partition type 912 having a size of 2N_0×2N_0, a partition type 914 having a size of 2N_0×N_0, a partition type 916 having a size of N_0×2N_0, and a partition type 918 having a size of N_0×N_0. FIG. 9 illustrates the partition types 912 through 918 which are obtained by symmetrically splitting the prediction unit 910, but a partition type is not limited thereto. For example, the partitions of the prediction unit 910 may include asymmetrical partitions, partitions having a predetermined shape, and partitions having a geometrical shape.

Prediction encoding is repeatedly performed on one partition having a size of 2N_0×2N_0, two partitions having a size of 2N_0×N_0, two partitions having a size of N_0×2N_0, and four partitions having a size of N_0×N_0, according to each partition type. The prediction encoding performed in an intra mode and an inter mode may be performed on the partitions having the sizes of 2N_0×2N_0, N_0×2N_0, 2N_0×N_0, and N_0×N_0. The prediction encoding in a skip mode is performed only on the partition having the size of 2N_0×2N_0.

If the smallest encoding error is in one of the partition types 912 through 916 having the sizes of 2N_0×2N_0, 2N_0×N_0, and N_0×2N_0, the prediction unit 910 may not be split into a lower depth.

If the encoding error is the smallest in the partition type 918 having the size of N_0×N_0, a depth is changed from 0 to 1 to split the partition type 918 in operation 920, and encoding is repeatedly performed on partition type coding units having a depth of 2 and a size of N_0×N_0 to search for a minimum encoding error.

A prediction unit 940 for prediction encoding of the (partition type) coding unit 930 having a depth of 1 and a size of 2N_1×2N_1 (=N_0×N_0) may include partitions of a partition type 942 having a size of 2N_1×2N_1, a partition type 944 having a size of 2N_1×N_1, a partition type 946 having a size of N_1×2N_1, and a partition type 948 having a size of N_1×N_1.

If an encoding error is the smallest in the partition type 948 having the size of N_1×N_1, a depth is changed from 1 to 2 to split the partition type 948 in operation 950. Encoding is repeatedly performed on coding units 960, which have a depth of 2 and a size of N_2×N_2 to search for a minimum encoding error.

When a maximum depth is d, a split operation according to depth may be performed until a depth becomes d−1, and split information may be encoded until the depth is one of 0 to d−2. In other words, when encoding is performed up to when the depth is d−1 after a coding unit corresponding to a depth of d−2 is split in operation 970, a prediction unit 990 for prediction encoding a coding unit 980 having a depth of d−1 and a size of 2N_(d−1)×2N_(d−1) may include partitions of a partition type 992 that has a size of 2N_(d−1)×2N_(d−1), a partition type 994 that has a size of 2N_(d−1)×N_(d−1), a partition type 996 that has a size of N_(d−1)×2N_(d−1), and a partition type 998 that has a size of N_(d−1)×N_(d−1).

Prediction encoding may be repeatedly performed on one partition having a size of 2N_(d−1)×2N_(d−1), two partitions having a size of 2N_(d−1)×N_(d−1), two partitions having a size of N_(d−1)×2N_(d−1), four partitions having a size of N_(d−1)×N_(d−1) from among the partition types 992 through 998, to search for a partition type that has a minimum encoding error.

Even when the partition type 998 having the size of N_(d−1)×N_(d−1) has the minimum encoding error, because a maximum depth is d, a coding unit CU_(d−1) having a depth of d−1 is no longer split to a lower depth, and a coded depth for the coding units included in the current maximum coding unit 900 is determined to be d−1 and a partition type of the current maximum coding unit 900 may be determined to be N_(d−1)×N_(d−1). Also, because the maximum depth is d, split information for the minimum coding unit 952 is not set.

A data unit 999 may be a 'minimum unit' for the current maximum coding unit. A minimum unit may be a rectangular data unit that is obtained by splitting the minimum coding unit 980 by 4. By performing the encoding repeatedly, the video encoding apparatus 100 may select a depth that has the least encoding error by comparing encoding errors according to depths of the coding unit 900 to determine a coded depth, and may set a corresponding partition type and a prediction mode as an encoding mode of the coded depth.

The minimum encoding errors according to depths are compared in depths of 1 through d, and a depth that has the least encoding error may be determined as a coded depth. The coded depth, the partition type of the prediction unit, and the prediction mode may be encoded and transmitted as information about an encoding mode. Also, because a coding unit is split from a depth of 0 to a coded depth, only split information of the coded depth is set to 0, and split information of depths excluding the coded depth is set to 1.

The entropy decoder 220 of the video decoding apparatus 200 may extract and use information about the coded depth and a prediction unit of the coding unit 900 to decode the coding unit 912. The video decoding apparatus 200 may determine a depth, in which split information is 0, as a coded depth using split information according to depths, and use information about an encoding mode of the corresponding depth for decoding.

Figure 10:
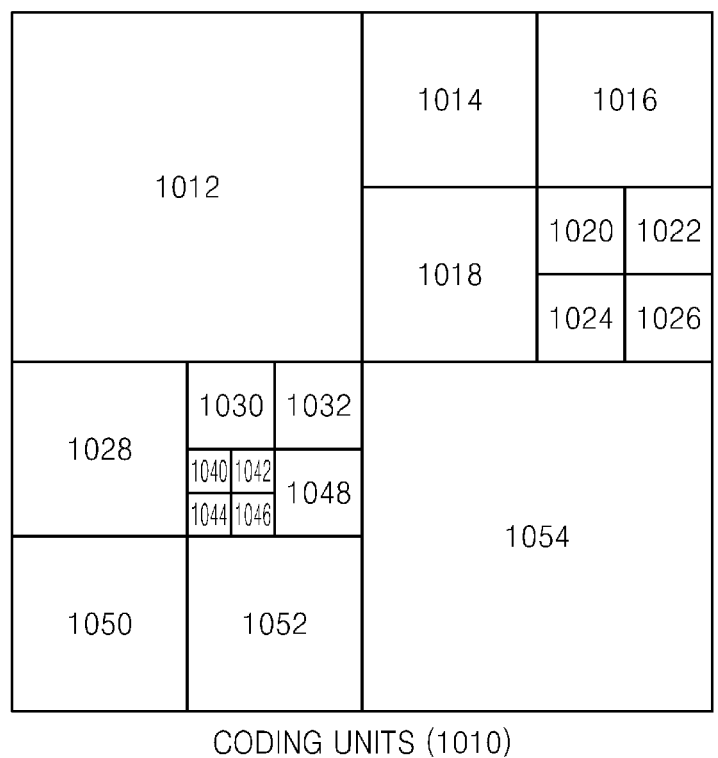
FIGS. 10 through 12 are diagrams illustrating a relationship between coding units, prediction units, and frequency transformation units, according to an exemplary embodiment.
Figure 11:
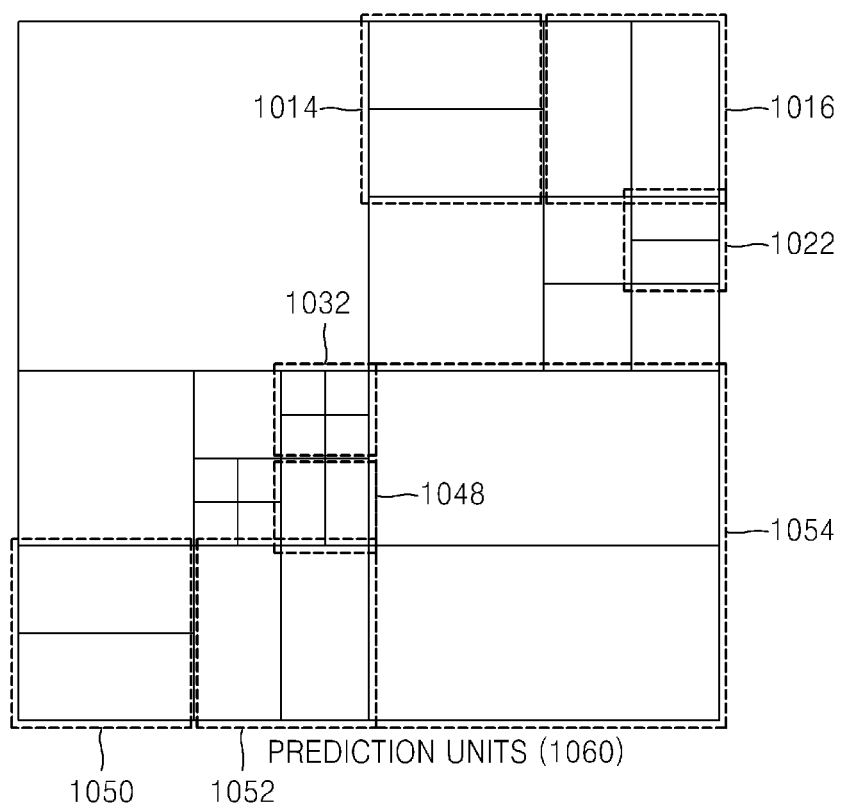
Figure 12:
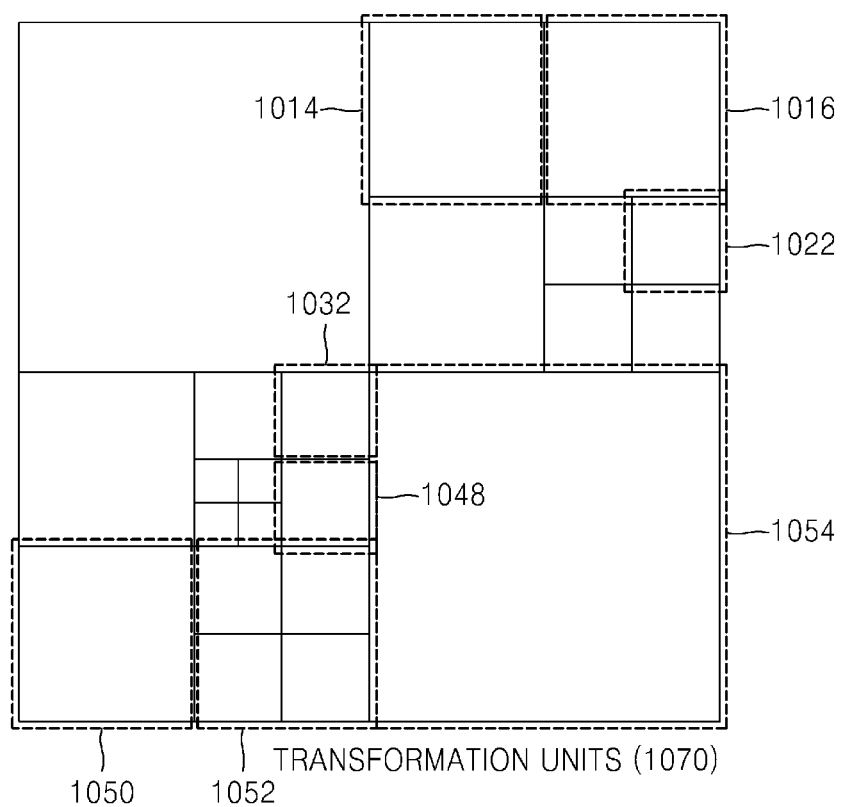

FIGS. 10 through 12 are diagrams illustrating a relationship between coding units 1010, prediction units 1060, and transformation units 1070 according to an exemplary embodiment.

Referring to FIG. 10, coding units 1010 have a tree structure, corresponding to coded depths determined by the video encoding apparatus 100, in a maximum coding unit. The prediction units 1060 are partitions of prediction units of the coding units 1010, and the transformation units 1070 are transformation units of the coding units 1010.

When a depth of a maximum coding unit is 0 in the coding units 1010, a depth of coding units 1012 and 1054 is 1, a depth of coding units 1014, 1016, 1018, 1028, 1050, and 1052 is 2, a depth of coding units 1020, 1022, 1024, 1026, 1030, 1032, and 1048 is 3, and a depth of coding units 1040, 1042, 1044, and 1046 is 4.

In the prediction units 1060, coding units 1014, 1016, 1022, 1032, 1048, 1050, 1052, and 1054 are obtained by splitting the coding units. Partition types in the coding units 1014, 1022, 1050, and 1054 have a size of 2N×N, partition types in the coding units 1016, 1048, and 1052 have a size of N×2N, and a partition type of the coding unit 1032 has a size of N×N. Prediction units and partitions of the coding units 1010 are smaller than or equal to each coding unit.

Transformation or inverse transformation is performed on image data of the coding unit 1052 in the transformation units 1070 by a data unit that is smaller than the coding unit 1052. The coding units 1014, 1016, 1022, 1032, 1048, 1050, 1052, and 1054 in the transformation units 1070 of FIG. 12 are different from the coding units in the prediction units 1060 in terms of sizes and shapes. In other words, the video encoding apparatus 100 and the video decoding apparatus 200 may perform intra prediction, motion estimation, motion compensation, transformation, and inverse transformation individually on a data unit in the same coding unit.

Accordingly, encoding is recursively performed on each of the coding units having a hierarchical structure in each region of a maximum coding unit to determine an optimum coding unit, and thus, coding units having a recursive tree structure may be obtained. Encoding information may include split information about a coding unit, information about a partition type, information about a prediction mode, and information about a size of a transformation unit.

Table 1 shows the encoding information that may be set by the video encoding apparatus 100 and the video decoding apparatus 200.

The entropy encoder 120 of the video encoding apparatus 100 may output the encoding information about the coding units that have a tree structure, and the entropy decoder 220 of the video decoding apparatus 200 may extract the encoding information about the coding units that have the tree structure from a received bitstream.

Split information indicates whether a current coding unit is split into coding units of a lower depth. If split information of a current depth d is 0, a depth of a current coding unit that is no longer split into a lower depth, is a coded depth, and thus information about a partition type, a prediction mode, and a size of a transformation unit may be defined for the coded depth. If the current coding unit is further split according to the split information, encoding is independently performed on four split coding units of a lower depth.

A prediction mode may be one of an intra mode, an inter mode, and a skip mode. The intra mode and the inter mode may be defined in all partition types, and the skip mode is defined only in a partition type having a size of 2N×2N.

The information about the partition type may indicate symmetrical partition types that have sizes of 2N×2N, 2N×N, N×2N, and N×N, which are obtained by symmetrically splitting a height or a width of a prediction unit. They also indicate asymmetrical partition types having sizes of 2N×nU, 2N×nD, nL×2N, and nR×2N, which are obtained by asymmetrically splitting the height or width of the prediction unit. The asymmetrical partition types having the sizes of 2N×nU and 2N×nD may be respectively obtained by splitting the height of the prediction unit in 1:n and n:1 (where n is an integer greater than 1). The asymmetrical partition types that have the sizes of nL×2N and nR×2N may be respectively obtained by splitting the width of the prediction unit in 1:n and n:1.

The size of the transformation unit may be set to be two types in the intra mode and two types in the inter mode. If split information of the transformation unit is 0, the size of the transformation unit may be 2N×2N, which is also the size of the current coding unit. If split information of the transformation unit is 1, the transformation units may be obtained by splitting the current coding unit. If a partition type of the current coding unit having the size of 2N×2N is a symmetrical partition type, a size of a transformation unit may be N×N. If the partition type of the current coding unit is an asymmetrical partition type, the size of the transformation unit may be N/2×N/2.

The encoding information about coding units that have a tree structure may include at least one of a coding unit corresponding to a coded depth, a prediction unit, and a minimum

TABLE 1

| | Split Information 0 (Encoding on Coding Unit having Size of 2N × 2N and Current Depth of d) | | | | Split Information 1 |
|---|---|---|---|---|---|
| | Partition Type | | Size of Transformation Unit | | |
| Prediction Mode | Symmetrical Partition Type | Asymmetrical Partition Type | Split Information 0 of Transformation Unit | Split Information 1 of Transformation Unit | |
| Intra Inter Skip (Only 2N × 2N) | 2N × nU 2N × nD nL × 2N nR × 2N | 2N × nU 2N × nD nL × 2N nR × 2N | 2N × 2N | N × N (Symmetrical Partition Type) N/2 × N/2 (Asymmetrical Partition Type) | Repeatedly Encode Coding Units Having Lower Depth of d + 1 | unit. The coding unit may include at least one of a prediction unit and a minimum unit containing the same encoding information.

Accordingly, a determination can be made as to whether adjacent data units are included in the same coding unit corresponding to the coded depth by comparing encoding information of the adjacent data units. Also, a coding unit corresponding to a coded depth is determined using encoding information of a data unit, and thus, a distribution of coded depths in a maximum coding unit may be determined.

If a current coding unit is predicted based on encoding information of adjacent data units, encoding information of data units in deeper coding units adjacent to the current coding unit may be directly referred to and used. Alternatively, if a current coding unit is predicted based on encoding information of adjacent data units, data units adjacent to the current coding unit are searched using encoded information of the data units. The searched adjacent coding units may be referred to for predicting the current coding unit.

Figure 13:
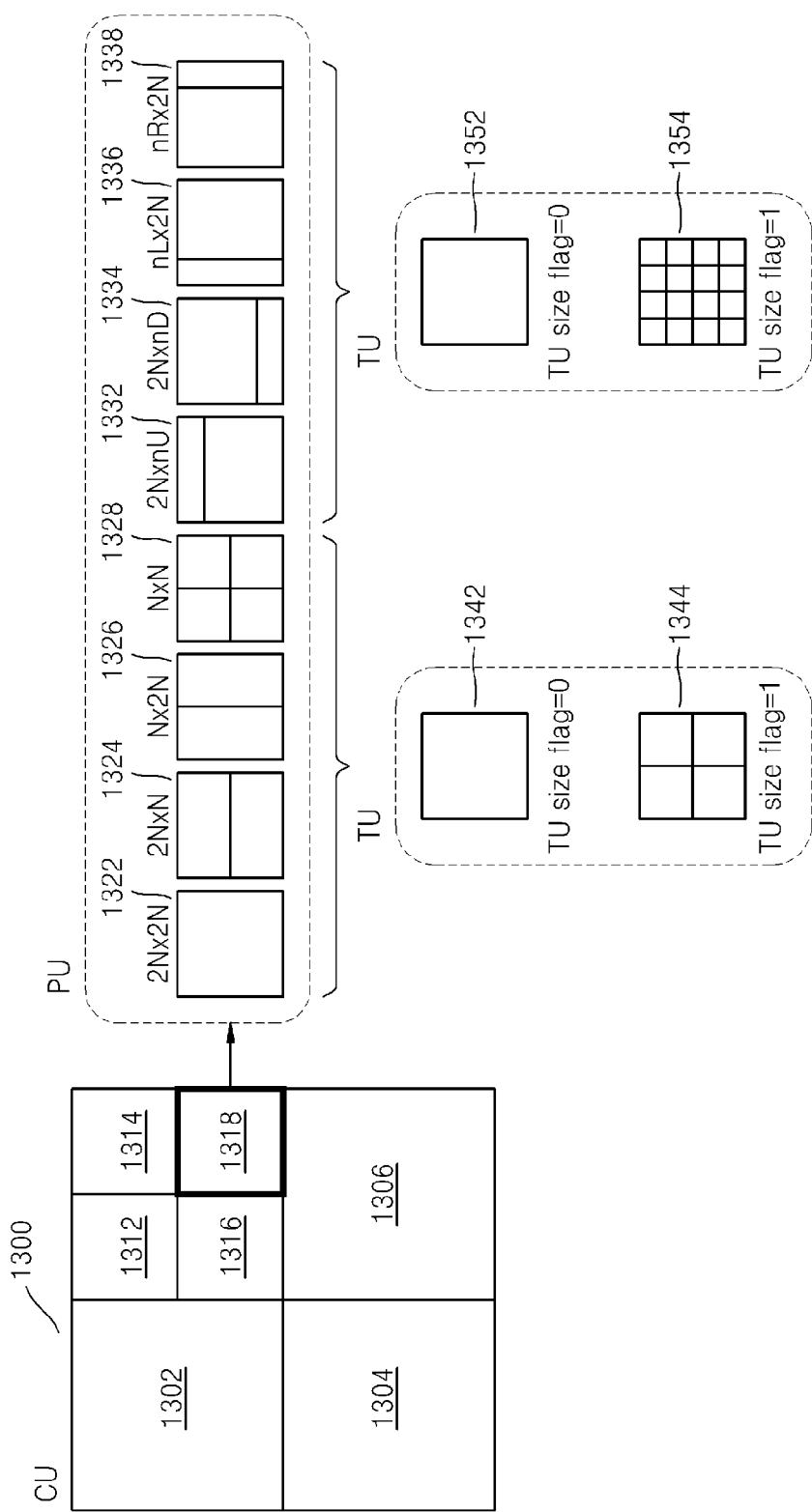
FIG. 13 is a diagram illustrating a relationship between a coding unit, a prediction unit, and a transformation unit, according to encoding mode information of Table 1.

FIG. 13 is a diagram illustrating a relationship between a coding unit, a prediction unit, and a transformation unit according to the encoding mode information of Table 1.

Referring to FIG. 13, a maximum coding unit 1300 includes coding units 1302, 1304, 1306, 1312, 1314, 1316, and 1318 of coded depths. The coding unit 1318 is a coding unit of a coded depth, therefore, split information may be set to 0. Information about a partition type of the coding unit 1318 that has a size of 2N×2N may be set to a partition type 1322 having a size of 2N×2N, a partition type 1324 having a size of 2N×N, a partition type 1326 having a size of N×2N, a partition type 1328 having a size of N×N, a partition type 1332 having a size of 2N×nU, a partition type 1334 having a size of 2N×nD, a partition type 1336 having a size of nL×2N, and a partition type 1338 having a size of nR×2N.

When the partition type is set to be symmetrical, for example, the partition type 1322, 1324, 1326, or 1328, a transformation unit 1342 having a size of 2N×2N is set if split information (TU size flag) of a transformation unit is 0, and a transformation unit 1344 having a size of N×N is set if a TU size flag is 1.

When the partition type is set to be asymmetrical, for example, the partition types 1332, 1334, 1336, or 1338, a transformation unit 1352 having a size of 2N×2N is set if a TU size flag is 0, and a transformation unit 1354 having a size of N/2×N/2 is set if a TU size flag is 1. The TU size flag is a type of transformation index. A size of a transformation unit corresponding to a transformation index may be modified according to a prediction unit type or a partition type of a coding unit.

When the partition type is set to be symmetrical such as the partition types 1322, 1324, 1326, or 1328, the transformation unit 1342 having a size of 2N×2N is set if a TU size flag of a transformation unit is 0, and the transformation unit 1344 having a size of N×N is set if a TU size flag is 1.

When the partition type is set to be asymmetrical, such as the partition types 1332 (2N×nU), 1334 (2N×nD), 1336 (nL× 2N), or 1338 (nR×2N), the transformation unit 1352 having a size of 2N×2N is set if a TU size flag is 0, and the transformation unit 1354 having a size of N/2×N/2 is set if a TU size flag is 1.

Referring again to FIG. 9, the TU size flag described above is a flag that may have a value of 0 or 1, but the TU size flag is not limited to 1 bit, and a transformation unit may be hierarchically split while the TU size flag increases from 0. The transformation unit split information (TU size flag) may be used as an example of a transformation index.

In this case, when a TU size flag is used that has a maximum size and a minimum size of a transformation unit, the size of the used transformation unit may be expressed. The video encoding apparatus 100 may encode maximum transformation unit size information, minimum transformation unit size information, and maximum transformation unit split information. The encoded information may be inserted into a sequence parameter set (SPS). The video decoding apparatus 200 may use the maximum transformation unit size information, the minimum transformation unit size information, and the maximum transformation unit split information for video decoding.

For example, if a size of a current coding unit is 64×64 and a size of a maximum transformation unit is 32×32, a size of a transformation unit is 32×32 if a TU size flag is 0. As another example, a size of a transformation unit is 16×16 if a TU size flag is 1, and a size of a transformation unit is 8×8 if a TU size flag is 2.

Alternatively, if a size of a current coding unit is 32×32 and a minimum transformation unit is 32×32, a size of a transformation unit is 32×32 if a TU size flag is 0. Also, in this example the size of a transformation unit cannot be smaller than 32×32, accordingly, no more TU size flags may be set.

Alternatively, if a size of a current encoding unit is 64×64 and a maximum TU size flag is 1, a TU size flag may be 0 or 1 and no other TU size flags may be set.

When defining a maximum TU size flag as 'MaxTransformSizeIndex', a minimum TU size flag as 'MinTransformSize', and a transformation unit in the case when a TU size flag is 0, (i.e. a basic transformation unit RootTu as 'RootTuSize'0), a size of a minimum transformation unit 'CurrMinTuSize' that is available in a current coding unit may be defined by Equation (1) as illustrated below.

$$\text{CurrMinTuSize} = \max(\text{MinTransformSize}, \text{RootTuSize}/(2^{\text{MaxTransformSizeIndex}})) \qquad (1)$$

In comparison with the size of the minimum transformation unit 'CurrMinTuSize' that is available in the current coding unit, the basic transformation unit size 'RootTuSize' may indicate a maximum transformation unit which may be selected in regard to a system. According to Equation (1), RootTuSize/(2^MaxTransformSizeIndex)' is a size of a transformation unit that is obtained by splitting 'RootTuSize', which is a size of a transformation unit when transformation unit split information is 0, by a number of times corresponding to the maximum transformation unit split information. Also, 'MinTransformSize' is a size of a minimum transformation unit, and thus, a smaller value of these may be 'CurrMinTuSize' which is the size of the minimum transformation unit that is available in the current coding unit.

The size of the basic transformation unit 'RootTuSize' according to an exemplary embodiment, may vary according to a prediction mode. For example, if a current prediction mode is an inter mode, RootTuSize may be determined according to Equation (2) as illustrated below. In Equation (2), 'MaxTransformSize' refers to a maximum transformation unit size, and 'PUSize' refers to a current prediction unit size.

$$\text{RootTuSize} = \min(\text{MaxTransformSize}, \text{PUSize}) \qquad (2)$$

If a current prediction mode is an inter mode, the size of the basic transformation unit 'RootTuSize', may be set to a smaller value from among the maximum transformation unit size and the current prediction unit size.

If a prediction mode of a current partition unit is an intra mode, 'RootTuSize' may be determined according to Equation (3) below. Here, 'PartitionSize' refers to a size of the current partition unit.

$$RootTuSize=\min(MaxTransformSize, PartitionSize) \quad (3)$$

If a current prediction mode is an intra mode, the basic transformation unit size 'RootTuSize' may be set to a smaller value from among the maximum transformation unit size and the current partition unit size. It should be noted that the size of the basic transformation unit size RootTuSize', which is the current maximum transformation unit size in this example and varies according to a prediction mode of a partition unit, and factors for determining the current maximum transformation unit size are not limited thereto.

Hereinafter, an entropy encoding operation of a syntax element, which is performed in the entropy encoder 120 of the video encoding apparatus 100 of FIG. 1, and an entropy decoding operation of a syntax element, which is performed in the entropy decoder 220 of the video decoding apparatus 200 of FIG. 2 is described.

As described above, the video encoding apparatus 100 and the video decoding apparatus 200 perform encoding and decoding by splitting a maximum coding unit into coding units that are smaller than or equal to a maximum coding unit. A prediction unit and a transformation unit used for prediction and transformation may be determined based on costs independently from other data units. Accordingly, an optimum coding unit may be determined by recursively encoding each coding unit that has a hierarchical structure included in the maximum coding unit, and data units having a tree structure may be configured. For each maximum coding unit, a coding unit that has a tree structure, and a prediction unit and a transformation unit each that have a tree structure may be configured. For decoding, hierarchical information, which is information indicating structural information of data units that have a hierarchical structure and non-hierarchical information for decoding, besides the hierarchical information, may be transmitted.

The information related to a hierarchical structure may be used to determine a coding unit having a tree structure, a prediction unit having a tree structure, and a transformation unit having a tree structure, as described above with reference to FIGS. 10 through 12. The information related to the hierarchical structure may include a transformation unit split flag (TU size flag) indicating a size of a maximum coding unit, coded depth, partition information of a prediction unit, a split flag indicating whether a coding unit is split or not, size information of a transformation unit, and a transformation unit split flag (TU size flag) indicating whether a transformation unit is split or not. Examples of coding information other than hierarchical structure information include prediction mode information of intra and inter prediction applied to each prediction unit, motion vector information, prediction direction information, color component information applied to each data unit in the case in which a plurality of color components are used, and transformation coefficient information. Hereinafter, hierarchical information and extra-hierarchical information may be referred to as a syntax element which is to be entropy encoded or entropy decoded.

A method of determining a context model for efficiently entropy encoding and decoding a level of a transformation coefficient, that is, size information of syntax elements is provided. Hereinafter, a method of determining a context model for entropy encoding and decoding of a level of a transformation coefficient is described.

Figure 14:
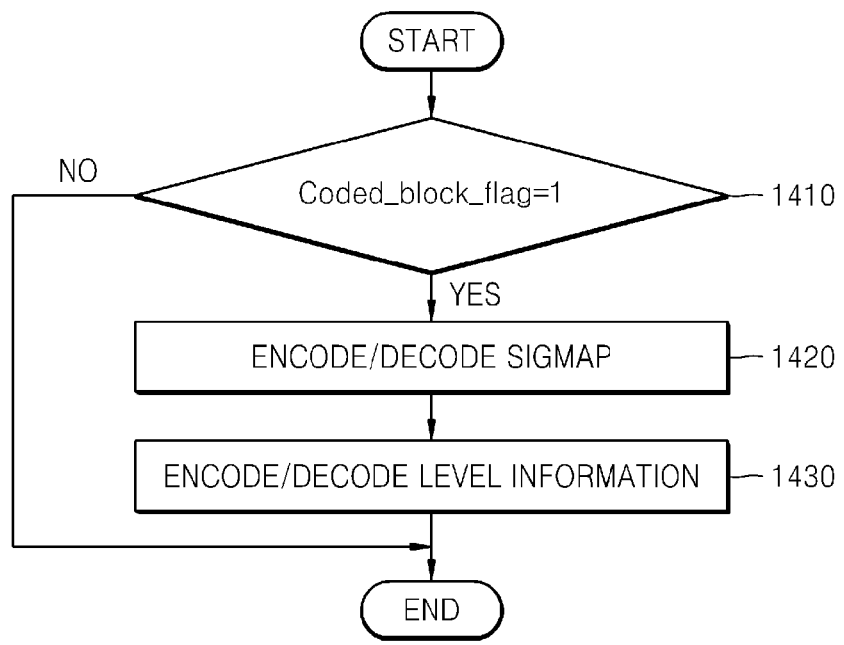
FIG. 14 is a flowchart illustrating a method of entropy encoding and decoding of transformation coefficient information included in a transformation unit, according to an exemplary embodiment.

FIG. 14 is a flowchart illustrating a method of entropy encoding and decoding of transformation coefficient information included in a transformation unit, according to an exemplary embodiment.

Referring to FIG. 14, coded_block_flag is used to indicate whether a transformation coefficient is not 0 (hereinafter, referred to as "significant coefficient"). In 1410, it is determined whether a transformation coefficient that does not equal 0 exists from among transformation coefficients included in a current transformation unit that is first entropy encoded or decoded.

If coded_block_flag is 0, then it is determined that there are only transformation coefficients of 0 in the current transformation unit, and thus, only a value of 0 is entropy encoded or decoded as coded_block_flag, and transformation coefficient level information is not entropy encoded or decoded.

If there is a significant coefficient in the current transformation unit, in 1420 a significance map (SigMap) indicating a location of a significant coefficient is entropy encoded or decoded.

A SigMap may be formed of a significant bit and predetermined information that indicates a location of a last significance coefficient. A significant bit is used to indicate whether a transformation coefficient according to each scan index is a significant coefficient or 0, and may be expressed by significant_coeff_flag[i]. As is further described, a significance map is set in units of subsets having a predetermined size which is obtained by splitting a transformation unit. Accordingly, a significant_coeff_flag[i] is used to indicate whether a transformation coefficient of an i-th scan index from among transformation coefficients included in a subset included in a transformation unit is 0 or not.

According to conventional Advanced Video Coding, MPEG-4 Part 10 (H.264), a flag (End-Of-Block) indicating whether each significant coefficient is the last significant coefficient or not is additionally entropy encoded or decoded. However, location information of the last significant coefficient itself is entropy encoded or decoded. As described above with reference to FIGS. 1 through 13, the size of a transformation unit is not limited to 4×4 but may also be a larger size such as 8×8, 16×16, or 32×32. It is inefficient to additionally entropy encode or decode a flag (End-Of-Block) indicating whether each significant coefficient is the last significant coefficient because the size of the flag (End-Of-Block) increases. Accordingly, the location information of the last significant coefficient may be entropy coded or decoded. For example, if a location of the last significant coefficient is (x, y), where x and y are integers, last_significant_coeff_x and last_significant_coeff_y which are syntax elements indicating coordinate values of (x, y) may be entropy encoded or decoded.

In operation 1430, transformation coefficient level information indicating a size of a transformation coefficient is entropy encoded or decoded. In the conventional H.264/AVC, level information of a transformation coefficient is expressed by coeff_abs_level_minus1 which is a syntax element. The level information may be expressed by coeff_abs_level_greater1_flag which is a syntax element indicating whether an absolute value of a transformation coefficient is greater than 1, coeff_abs_level_greater2_flag which is a syntax element indicating whether an absolute value of a transformation coefficient is greater than 2, and coeff_abs_level_remaining which indicates size information of the remaining transformation coefficient.

The syntax element coeff_abs_level_remaining which indicates the size information of the remaining transformation coefficient has a difference in a range between a size of a transformation coefficient (absCoeff) and a basic level value baseLevel that is determined using coeff_abs_level_greater1_flag and coeff_abs_level_greater2_flag. The baseLevel is determined according to the equation: baseLevel=1+ coeff_abs_level_greather1_flag+ coeff_abs_level_greather2flag, and coeff_abs_level_remaining is determined according to the equation: coeff_abs_level_remaining=absCoeff-baseLevel. While coeff_abs_level_greater1_flag and coeff_abs_level_greater2_flag has a value of 0 or 1, the basic level value baseLevel may have a value from 1 to 3. Accordingly, coeff_abs_level_remaining may vary from (absCoeff-1) to (absCoeff-3). As described above, (absCoeff-baseLevel), which is a difference between the size of an original transformation coefficient absCoeff and the basic level value baseLevel, is transmitted as size information of a transformation coefficient to reduce a size of transmitted data.

Figure 22:
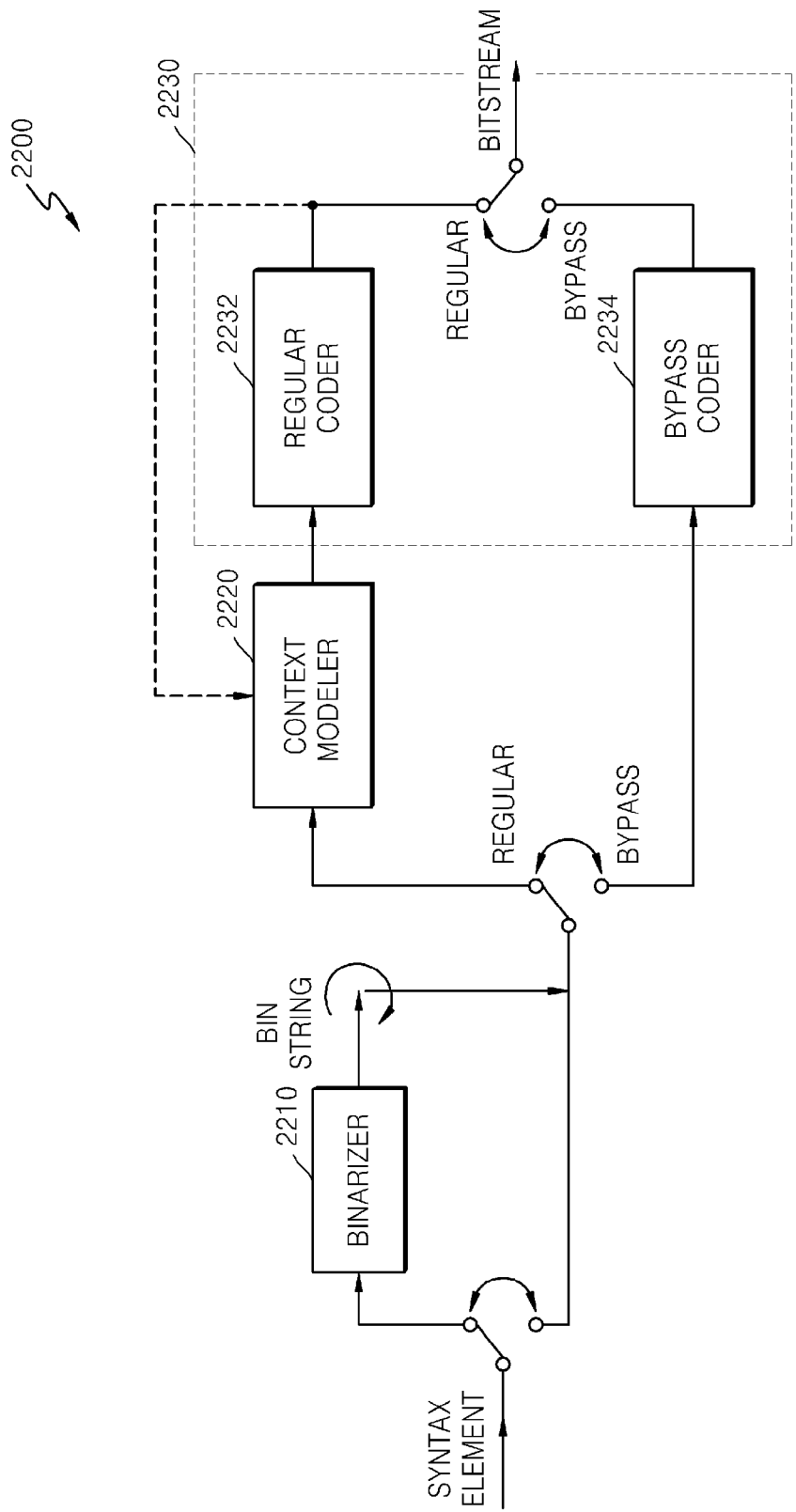
FIG. 22 is a block diagram illustrating an entropy encoding apparatus according to an exemplary embodiment.

FIG. 22 is a block diagram illustrating an entropy encoding apparatus 2200 according to an exemplary embodiment. The entropy encoding apparatus 2200 of FIG. 22 corresponds to the entropy encoder 120 of the video encoding apparatus 100 of FIG. 1.

Referring to FIG. 22, the entropy encoding apparatus 2200 includes a binarizer 2210, a context modeler 2220, and a binary arithmetic coder 2230. Also, the binary arithmetic coder 2230 includes a regular coder 2232 and a bypass coder 2234.

When syntax elements that are input to the entropy encoding apparatus 2100 are not binary values, the binarizer 2210 binarizes the syntax elements so as to output a Bin string consisting of binary values of 0 or 1. Bin denotes each bit of a stream consisting of 0 or 1, and is encoded by context adaptive binary arithmetic coding (CABAC). If a syntax element is data including 0 and 1 at the same frequencies, the syntax element is output to the bypass coder 2234 to be encoded.

The binarizer 2210 binarizes coeff_abs_level_remaining which is the syntax element indicating size information of a transformation coefficient, to a prefix bit string and a suffix bit string, using a parameter (cRiceParam). An operation of binarizing coeff_abs_level_remaining using the binarizer 2210 is described later.

The context modeler 2220 provides a probability model for encoding a bit string corresponding to a syntax element, to the regular coder 2232. The context modeler 2220 outputs a probability of a binary value for encoding each binary value of a bit string of a current syntax element, to the binary arithmetic coder 2230.

A context model is a probability model of a bin, and includes information about which bit of 0 and 1 corresponds to a most probable symbol (MPS) and a least probable symbol (LPS) and an MPS or LPS probability.

The regular coder 2232 performs binary arithmetic coding regarding a bit string corresponding to a syntax element based on information about the MPS and the LPS provided by the context modeler 2220 and the probability information of the MPS or the LPS.

A context model used in encoding coeff_abs_level_remaining may be set in advance according to a bin index of a transformation coefficient.

Figure 23:
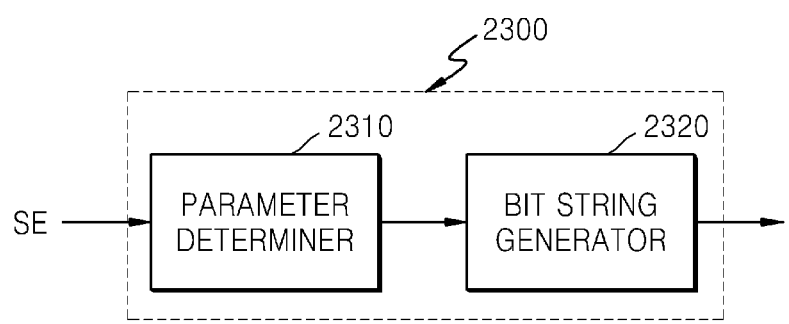
FIG. 23 is a block diagram illustrating a binarization apparatus according to an exemplary embodiment.

FIG. 23 is a block diagram illustrating a binarization apparatus 2300 according to an exemplary embodiment. The binarization apparatus 2300 of FIG. 23 corresponds to the binarizer 2210 of FIG. 22.

Referring to FIG. 23, the binarization apparatus 2300 includes a parameter determiner 2310 and a bit string generator 2320.

The parameter determiner 2310 compares a size of a previous transformation coefficient that is encoded before a current transformation coefficient, with a predetermined critical value. The predetermined critical value is obtained based on a previous parameter used in binarization of a previous transformation coefficient level syntax element indicating a size of the previous transformation coefficient to thereby determine whether to update the previous parameter. Also, the parameter determiner 2310 obtains a parameter to be used in binarization of a transformation coefficient level syntax element by updating or maintaining the previous parameter according to a result of the determination.

When a size of the previous transformation coefficient is cLastAbsCoeff, and the previous parameter is cLastRiceParam, the parameter determiner 2310 determines a parameter cRiceParam that is to be used in binarization of the transformation coefficient level syntax element, coeff_abs_level_remaining, which indicates the size of the current transformation coefficient, based on the following algorithm.

cRiceParam=Min(cLastRiceParam+(cLastAbsLevel>(3*(1<<cLastRiceParam))?1:0),4)

This algorithm may be implemented by the following pseudo code.
{
If    cLastAbsCoeff>3*(1<<cLastRiceParam)
cRiceParam=Min (cLastRiceParam+1, 4)
}

As described in the above algorithm, the parameter determiner 2310 compares a critical value th which is obtained based on the following equation: th=3*(1<<cLastRiceParam), and cLastRiceParam. The parameter determiner 2310 renews or otherwise changes or updates the previous parameter (cLastRiceParam) by increasing the same by 1 when cLastAbsCoeff is greater than the critical value th, and maintains the previous parameter without renewing when cLastAbsCoeff is less than or equal to the critical value th.

An initial parameter is set to 0. When a parameter (cRiceParam) is updated, it is gradually increased by +1 in comparison to the previous parameter (cLastRiceParam). Also, the critical value th that is used in determining conditions for updating of a parameter is determined according to the parameter (cRiceParam), and thus, as the parameter (cRiceParam) is updated, the critical value th is also gradually increased. That is, the critical value th is set to have a value that is proportional to the previous parameter (cLastRiceParam). When the previous parameter (cLastRiceParam) is updated, the parameter (cRiceParam) has a value that is gradually increased by +1 in comparison to the previous parameter (cLastRiceParam). As the parameter (cRiceParam) is updated within the range of 0 to 4, the critical value th is gradually increased to 3, 6, 12, and 24.

The bit string generator 2320 binarizes the transformation coefficient level syntax element (coeff_abs_level_remaining) of a transformation coefficient using a parameter, and outputs a bit string corresponding to the transformation coefficient level syntax element (coeff_abs_level_remaining) of a transformation coefficient.

The bit string generator 2320 obtains a parameter cTrMax according to the following equation: cTrMax=4<<cRiceParam, using the obtained parameter (cRiceParam). The parameter CtrMax is used as a standard for dividing the transformation coefficient level syntax element (coeff_abs_level_remaining) into a prefix and a suffix.

The bit string generator 2320 divides a value of the transformation coefficient level syntax element (coeff_abs_level_remaining) based on the parameter cTrMax to obtain a prefix that has a value that does not exceed the parameter cTrMax and a suffix indicating a portion that exceeds the parameter cTrMax. The bit string generator 2320 determines a prefix within a range that does not exceed cTrMax according to the following equation: Prefix=Min (cTrMax, coeff_abs_level_remaining). A suffix exists only when the transformation coefficient level syntax element (coeff_abs_level_remaining) has a greater value than cTrMax. The suffix is a value corresponding to (coeff_abs_level_remaining−cTrMax). When the transformation coefficient level syntax element (coeff_abs_level_remaining) does not exceed cTrMax, only a prefix exists. For example, when the transformation coefficient level syntax element (coeff_abs_level_remaining) is 10, and the parameter cTrMax is 7, the transformation coefficient level syntax element (coeff_abs_level_remaining) is sorted into a prefix having a value of 7 and a suffix having a value of 3. Alternatively, when the transformation coefficient level syntax element (coeff_abs_level_remaining) is 6, and the parameter cTrMax is 7, the transformation coefficient level syntax element (coeff_abs_level_remaining) is sorted into a prefix having a value of 6 and does not have a suffix.

When a prefix and a suffix are determined by dividing the value of the transformation coefficient level syntax element (coeff_abs_level_remaining) based on the parameter cTrMax, the bit string generator 2320 binarizes the prefix and the suffix using a predetermined binarization method that is set in advance, and outputs bit strings corresponding to the prefix and the suffix. For example, the bit string generator 2320 may output a bit string by binarizing a prefix having a value corresponding to Min (cTrMax, coeff_abs_level_remaining) using a truncated unary binarization method. The bit string generator 2320 may output a bit string by binarizing a suffix having a value corresponding to (coeff_abs_level_remaining−cTrMax) using a k-th exponential Golomb method. A value of k may be determined using the parameter (cRiceParam) that is determined using the parameter determiner 2310. For example, the value of k may have a value of cRiceParam+1.

According to the truncated unary binarization method, the prefix having a value of Min (cTrMax, coeff_abs_level_remaining) may be binarized as shown in Table 2 below.

TABLE 2

| Min (cTrMax, coeff_abs_level_remaining) | Output bit string |
|---|---|
| 0 | 0 |
| 1 | 10 |
| 2 | 110 |
| 3 | 1110 |
| ... | ... |

The bit string generator 2320 may generate a bit string corresponding to a prefix and a suffix according to the parameter (cRiceParam) and by referring to a table that is set in advance. In a lookup table method, the table set in advance may be set such that a length of a bit string corresponding to a relatively great value is reduced as the value of the parameter (cRiceParam) increases.

An operation of entropy encoding a syntax element related to a transformation unit according to an exemplary embodiment is described with reference to FIGS. 15 through 21.

Figure 15:
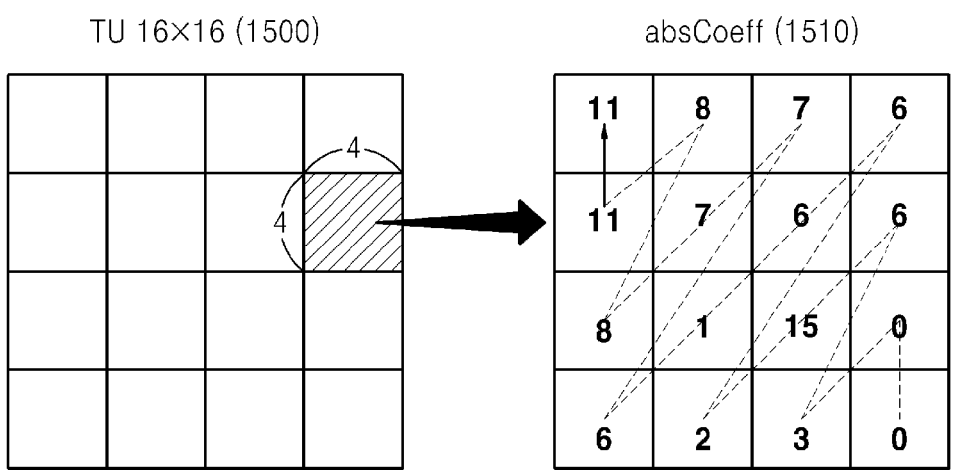
FIG. 15 illustrates a transformation unit that is entropy encoded according to an exemplary embodiment.

FIG. 15 illustrates a transformation unit 1500 that is entropy encoded according to an exemplary embodiment. While the transformation unit 1500 having a 16×16 size is illustrated in FIG. 15, the size of the transformation unit 1500 is not limited to the illustrated size of 16×16 but may also be of various sizes such as ranging from 4×4 to 32×32.

Referring to FIG. 15, for entropy encoding and decoding of the transformation coefficient included in the transformation unit 1500, the transformation unit 1500 may be divided into smaller transformation units. Hereinafter, an operation of entropy encoding a syntax element related to a 4×4 transformation unit 1510 included in the transformation unit 1500 is described. This operation of entropy encoding a syntax element related to the 4×4 transformation unit 1510 may also be applied to a transformation unit of different sizes.

Transformation coefficients included in the 4×4 transformation unit 1510 each have a transformation coefficient (absCoeff) as illustrated in FIG. 15. The transformation coefficients included in the 4×4 transformation unit 1510 may be serialized according to a predetermined scanning order as illustrated in FIG. 15 and sequentially processed. However, the scanning order is not limited as illustrated but may also be modified.

As described above, examples of syntax elements related to the 4×4 transformation unit 1510 are significant_coeff_flag which is a syntax indicating whether each transformation coefficient included in a transformation unit is a significant transformation coefficient that has a value that is not 0, coeff_abs_level_greater1_flag which is a syntax element indicating whether an absolute value of the transformation coefficient is greater than 1, coeff_abs_level_greater2_flag which is a syntax element indicating whether the absolute value s is greater than 2, and coeff_abs_level_remaining which is a syntax element indicating size information of the remaining transformation coefficients.

FIG. 16 illustrates a significance map SigMap 1600 corresponding to the transformation unit 1510 of FIG. 15 according to an exemplary embodiment.

Referring to FIGS. 15 and 16, the significance map SigMap 1600 that has a value of 1 for each of the significant transformation coefficients that do not have a value that is 0, from among the transformation coefficients included in the 4×4 transformation unit 1510 of FIG. 15, is set. The significance map SigMap 1600 is entropy encoded or decoded using a previously set context model.

FIG. 17 illustrates coeff_abs_level_greater1_flag 1700 corresponding to the 4×4 transformation unit 1510 of FIG. 15.

Referring to FIGS. 15 through 17, coeff_abs_level_greater1_flag 1700 is set which is a flag indicating whether a corresponding significance transformation coefficient has a value greater than 1, regarding significant transformation coefficients in the SigMap 1600 that have a value of 1. When coeff_abs_level_greater1_flag 1700 is 1, it indicates that a corresponding transformation coefficient is a transformation coefficient that has a value that is greater than 1, and when coeff_abs_level_greater1_flag 1700 is 0, it indicates that a corresponding transformation coefficient is a transformation coefficient that has a value of 1. In FIG. 17, when coeff_abs_level_greater1_flag 1710 is at a position of a transformation coefficient that has a value of 1, the coeff_abs_level_greater1_flag 1710 has a value of 0.

FIG. 18 illustrates coeff_abs_level_greater2_flag 1800 corresponding to the 4×4 transformation unit 1510 of FIG. 15.

Referring to FIGS. 15 through 18, coeff_abs_level_greater2_flag 1800 indicating whether a corresponding transformation coefficient has a value that is greater than 2, regarding transformation coefficients for which the coeff_abs_level_greater1_flag 1700 is set to 1, is set. When coeff_abs_level_greater2_flag 1800 is 1, it indicates that a corresponding transformation coefficient is a transformation coefficient that has a value that is greater than 2, and when coeff_abs_level_greater2_flag 1800 is 0, it indicates that a corresponding transformation coefficient is a transformation coefficient having a value of 2. In FIG. 18, when coeff_abs_level_greater2_flag 1810 is at a position of a transformation coefficient having a value of 2, the coeff_abs_level_greater2_flag 1810 has a value of 0.

FIG. 19 illustrates coeff_abs_level_remaining 1910 corresponding to the 4×4 transformation unit 1510 of FIG. 15.

Referring to FIGS. 15 through 19, coeff_abs_level_remaining 1900 is a syntax element indicating size information of the remaining transformation coefficients and may be obtained by calculating (absCoeff-baseLevel) of each transformation coefficient.

As described above, coeff_abs_level_remaining 1900 has a difference in a range between the size of the transformation coefficient (absCoeff) and a basic level value baseLevel that may be determined using coeff_abs_level_greater1_flag and coeff_abs_level_greater2_flag. The basic level value baseLevel is determined according to the equation: baseLevel=1+coeff_abs_level_greather1flag+coeff_abs_level_greather2flag, and coeff_abs_level_remaining is determined according to the equation: coeff_abs_level_remaining=absCoeff-baseLevel.

The parameter determiner 2310 reads the coeff_abs_level_remaining 1900 according to the illustrated scanning order to obtain sizes of transformation coefficients such as '0, 3, 12, 3, 3, 3, 4, 4, 5, 5, 8, 8'.

The parameter determiner 2310 sequentially determines a parameter (cRiceParam) that is used in binarization of size information of each transformation coefficient according to a scanning order. First, an initial parameter (cRiceParam) is set to 0. According to the above-described algorithm, the parameter increases only when a condition cLastAbsCoeff>3*(1<<cLastRiceParam) is satisfied. The initially set parameter (cRiceParam) is 0, and it maintains this value until a size of a previous transformation coefficient (cLastAbsCoeff) has a value of 3*(1<<0) which is a value greater than 3.

Referring to FIG. 19, a size of a third transformation coefficient '12' (1920) is greater than 3. Accordingly, when a size of a transformation coefficient which comes after the transformation coefficient '12' (1920) is binarized, a parameter (cRiceParam) having a value that is updated from 0 to 1 is used. When the parameter (cRiceParam) is renewed to 1, the parameter (cRiceParam) is renewed again only when a condition of cLastAbsCoeff>3*(1<<1), that is, cLastAbsCoeff>6, is satisfied. Referring to FIG. 19, '8' (1930) is a size of a second transformation coefficient from the last from the last transformation coefficient and is greater than 6, and thus, the parameter (cRiceParam) is renewed from 1 to 2.

Figure 20:
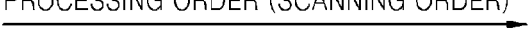
FIG. 20 illustrates a table of syntax elements related to the transformation units illustrated in FIGS. 15 through 19.

FIG. 20 illustrates a table of syntax elements related to the transformation units 1510, 1600, 1700, 1800, and 1900 illustrated in FIGS. 15 through 19. In FIG. 20, GTR1 denotes coeff_abs_level_greater1_flag; GTR2 denotes coeff_abs_level_greater2_flag, and the Remaining field denotes coeff_abs_level_remaining. Referring to FIG. 20, a syntax element indicating a transformation coefficient level, coeff_abs_level_remaining, is not a binary value and thus is binarized using a parameter.

Figure 21:
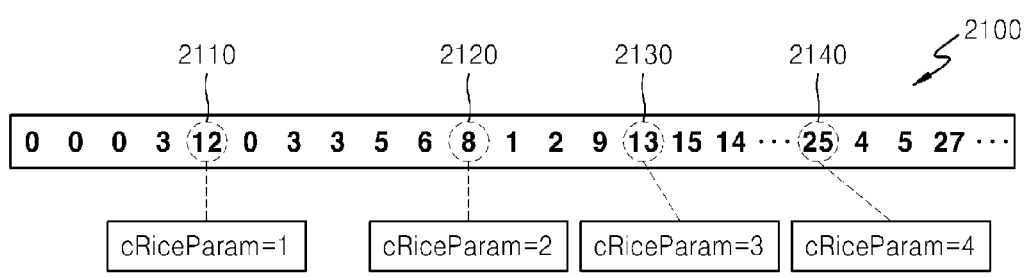
FIG. 21 illustrates another example of coeff_abs_level_remaining that is binarized according to an exemplary embodiment.

FIG. 21 illustrates another example of coeff_abs_level_remaining that is binarized according to an exemplary embodiment.

As described above, an initial parameter (cRiceParam) is set to 0, and increases by +1 only when a condition of cLastAbsCoeff>3*(1<<cLastRiceParam) is satisfied. The initial parameter (cRiceParam) has a value of Min (cLastRiceParam+1, 4), and thus, the renewed parameter may not have a value that exceeds 4. A critical value, 3*(1<<cLastRiceParam), that is used in determining whether to renew a parameter has a value of 3*(1<<0), 3*(1<<1), 3*(1<<2) or 3*(1<<3) according to a previous parameter (cRiceParam) used in the binarization of the size of the previous transformation coefficient. Accordingly, the parameter (cRiceParam) increases by +1 after processing of a transformation coefficient that has a value greater than 3, and then, increases by +1 after processing of a transformation coefficient that is greater than 6, and then increases by +1 after processing of a transformation coefficient that is greater than 12, and increases by +1 a final time after a transformation coefficient greater than 24 is processed. That is, the parameter (cRiceParam) gradually increases by +1 when abrupt variation in values exist from among transformation coefficients.

Referring to FIG. 21, the parameter (cRiceParam) that has an initially set value of 0 increases by +1 after processing of a transformation coefficient 2110 that has a value of 12, and is greater than 3 for the first time. After the transformation unit 2110 that has a value of 12, the renewed parameter (cRiceParam) is maintained until a transformation unit that is greater than 6 which is a next critical value is processed. After a transformation coefficient 2120 is processed having a value of 8 that is greater than 6, which is the next critical value, the parameter (cRiceParam) increases by +1 to have a value of 2. After the transformation unit 2120 having a value of 8, the renewed parameter (cRiceParam) is maintained until a transformation unit greater than 12 which is a next critical value is processed. After the transformation unit 2120 having a value of 8, after a transformation coefficient 2130 having a value of 13 that is greater than 12, which is the next critical value, is processed, the parameter (cRiceParam) increases by +1 to have a value of 3.

After the transformation unit 2130 having a value of 13, the renewed parameter (cRiceParam) is maintained until a transformation unit greater than 24 is processed which is a next critical value. After the transformation unit 2130 having a value of 13, a transformation coefficient 2140 that has a value of 25 that is greater than 24, is processed. Accordingly, the parameter (cRiceParam) increases by +1 to have a value of 4. In the binarization operations of transformation coefficients after the transformation coefficient 2140 having a value of 25, because the parameter (cRiceParam) has reached the maximum of 4, the parameter (cRiceParam) of 4 is used, and the renewing operation is no longer performed.

As described above, when the parameter (cRiceParam) used in binarization of the transformation coefficient level syntax element coeff_abs_level_remaining is determined using the parameter determiner 2310, the bit string generator 2320 sorts the transformation coefficient level syntax element coeff_abs_level_remaining into a prefix and a suffix based on the parameter (cTrMax) that is determined by using the parameter (cRiceParam). The bit string generator 2320 binarizes the prefix and the suffix by applying binarization methods that are set in advance with respect to the prefix and the suffix to thereby output bit strings corresponding to coeff_abs_level_remaining.

Figure 24:
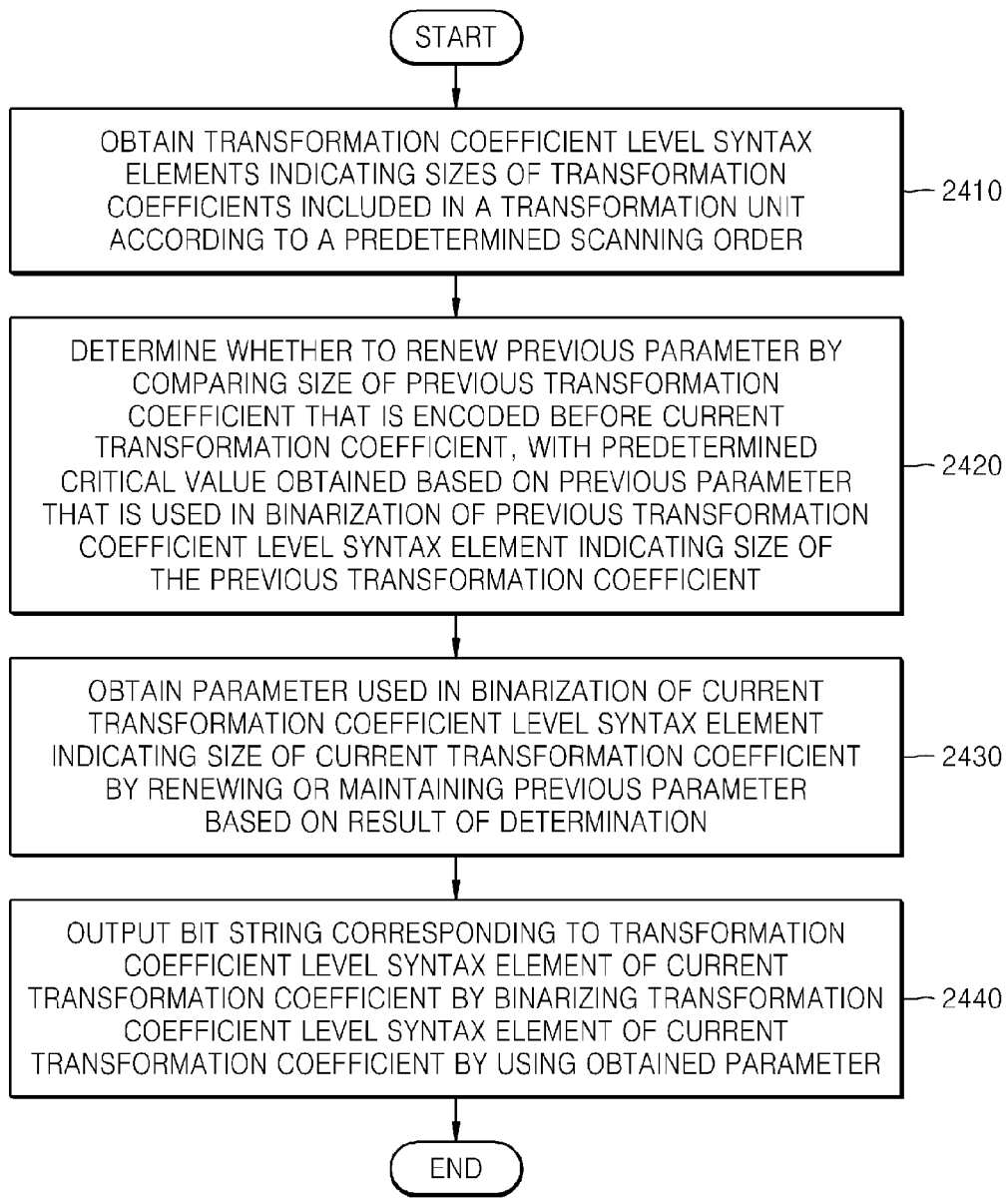
FIG. 24 is a flowchart illustrating a method of entropy encoding of syntax elements indicating a transformation coefficient level according to an exemplary embodiment.

FIG. 24 is a flowchart illustrating an entropy encoding method for syntax elements indicating a transformation coefficient level according to an exemplary embodiment.

Referring to FIG. 24, in operation 2410, the parameter determiner 2310 obtains transformation coefficient level syntax elements (coeff_abs_level_remaining) indicating sizes of transformation coefficients that are included in a transformation unit according to a predetermined scanning order.

In operation 2420, the parameter determiner 2310 compares a size of a previous transformation coefficient (cLastAbsCoeff) that is encoded before a current transformation coefficient, with a predetermined critical value. The predetermined critical value is obtained based on the previous parameter (cLastRiceParam) used in binarization of previous transformation coefficient level syntax elements indicating the size of the previous transformatoni coefficient (cLastAbsCoeff), to thereby determine whether to renew the previous parameter (cLastRiceParam).

In operation 2430, the parameter determiner 2310 renews or maintains the previous parameter based on a result of the determination in 2420 to thereby obtain a parameter used in binarization of a transformation coefficient level syntax element indicating a size of the current transformation coefficient. As described above, the parameter determiner 2310 compares a critical value th obtained based on th=3*(1<<cLastRiceParam) with the previous parameter cLastRiceParam. When cLastAbsCoeff is greater than th, the parameter determiner 2310 renews the previous parameter by increasing the same by 1. However, when cLastAbsCoeff is not greater than th, the parameter determiner 2310 does not renew but instead maintains the previous parameter. When the previous parameter is renewed, the renewed parameter is gradually increased by +1.

In operation 2440, the bit string generator 2320 binarizes the transformation coefficient level syntax element (coeff_abs_level_remaining) using the obtained parameter (cRiceParam), and outputs a bit string corresponding to the transformation coefficient level syntax element (coeff_abs_level_remaining) of the current transformation coefficient.

According to the operation of entropy encoding a transformation coefficient level syntax element, even when there is a transformation coefficient having an abruptly large value from among transformation coefficients that are processed according to a predetermined scanning order, a parameter may not have to be abruptly modified but may instead be gradually increase by +1.

Meanwhile, an operation of updating a parameter in order to entropy encode a transformation coefficient level syntax element may also be applied in the binarization of syntax elements other than the transformation coefficient level syntax element.

The operation of updating a parameter may be applied in updating a parameter used in binarization of other syntax elements using a Golomb-Rice code. In addition, the method of updating a parameter may be applied in updating a parameter used in binarization of a syntax element by applying a binarization method such as a concatenate code binarization method. When a concatenate code is used, syntax elements are sorted into a prefix and a suffix. Here, the method of updating a parameter may be applied in updating a predetermined parameter for the purpose of determining a prefix and a suffix. Similarly, the method of updating a parameter may be applied in updating a parameter used in encoding a syntax element by using a fixed length code and a variable length code (VLC) table as in a low complexity entropy coding (LCEC) method.

Figure 25:
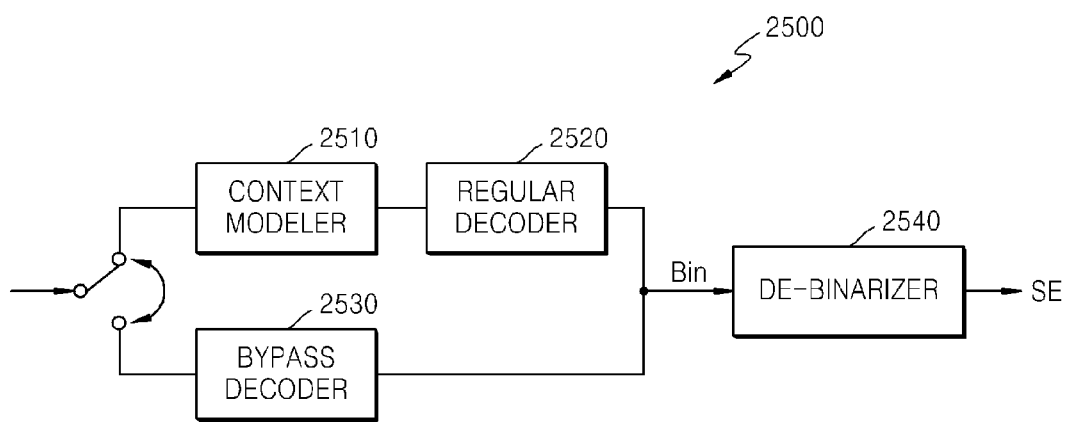
FIG. 25 is a block diagram illustrating an entropy decoding apparatus according to an exemplary embodiment.

FIG. 25 is a block diagram illustrating an entropy decoding apparatus 2500 according to an exemplary embodiment. The entropy decoding apparatus 2500 corresponds to the entropy decoder 220 of the video decoding apparatus 200 of FIG. 2. The entropy decoding apparatus 2500 performs a reverse operation of the entropy encoding operation performed by the entropy encoding apparatus 2200 described above.

Referring to FIG. 25, the entropy decoding apparatus 2500 includes a context modeler 2510, a regular decoder 2520, a bypass decoder 2530, and a de-binarizer 2540.

A syntax element encoded using bypass coding is output to the bypass decoder 2530 to be decoded, and a syntax element encoded by regular coding is decoded using the regular decoder 2520. The regular decoder 2520 arithmetically decodes a binary value of a current syntax element based on a context model provided using the context modeler 2510 to output a bit string. A context model used in arithmetic decoding of a syntax element may be set in advance according to a bin index of a transformation coefficient.

The de-binarizer 2540 restores bit strings that are arithmetically decoded using the regular decoder 2520 or the bypass decoder 2530, to syntax elements again.

The entropy decoding apparatus 2500 arithmetically decodes syntax elements related to transformation units, such as SigMap, coeff_abs_level_greater1_flag, or coeff_abs_level_greater2flag, in addition to coeff_abs_level_remaining, and outputs the same. When the syntax elements are restored, data included in the transformation units may be decoded using inverse quantization, reverse transformation, and predictive decoding, based on the restored syntax elements.

Figure 26:
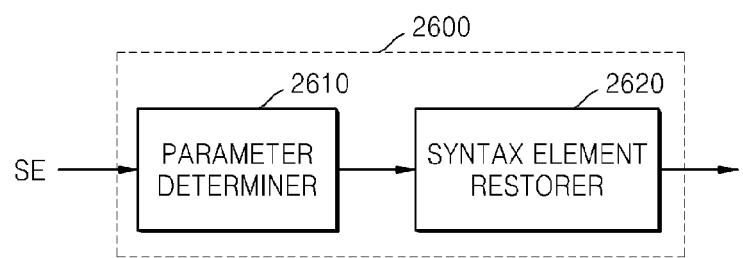
FIG. 26 is a block diagram illustrating a structure of a de-binarization apparatus according to an exemplary embodiment.

FIG. 26 is a block diagram illustrating a structure of a de-binarization apparatus 2600 according to an exemplary embodiment. The de-binarization apparatus 2600 of FIG. 26 corresponds to the de-binarizer 2540 of FIG. 25.

Referring to FIG. 26, the de-binarization apparatus 2600 includes a parameter determiner 2610 and a syntax element restorer 2620.

The parameter determiner 2610 compares a size of a previous transformation coefficient with a predetermined critical value. The predetermined critical value is obtained based on the previous parameter used in de-binarization of a previous transformation coefficient level syntax element, to thereby determine whether to renew the previous parameter. The parameter determiner 2610 renews or maintains the previous parameter based on a result of the determination to thereby obtain a parameter used in de-binarization of a transformation coefficient level syntax element. In the same manner as the parameter determiner 2310 of FIG. 23 described above, the parameter determiner 2610 compares a critical value th that is obtained based on the equation: th=3*(1<<cLastRiceParam) with a previous parameter cLastRiceParam. When cLastAbsCoeff is greater than th, the parameter determiner 2610 renews the previous parameter (cLastRiceParam) by increasing the same by 1. When cLastAbsCoeff is not greater than th, the parameter determiner 2610 does not renew but maintains the previous parameter (cLastRiceParam).

The syntax element restorer 2620 de-binarizes a bit string corresponding to the current transformation coefficient level syntax element using the obtained parameter to restore a syntax element (coeff_abs_level_remaining) indicating a size of the current transformation coefficient. The syntax element restorer 2620 sorts bit strings into a prefix bit string corresponding to a bit string that is obtained by binarizing a value corresponding to Min(cTrMax, coeff_abs_level_remaining) using a truncated unary binarization method and a suffix bit string corresponding to a bit string that is obtained by binarizing a value corresponding to (coeff_abs_level_remaining-cTrMax) using a k-th (k is cRiceParam+1) exponential Golomb method. The syntax element restorer 2620 restores the syntax element (coeff_abs_level_remaining) by de-binarizing the prefix bit string using the truncated unary binarization method and the suffix bit string using the k-th exponentional Golomb method.

Figure 27:
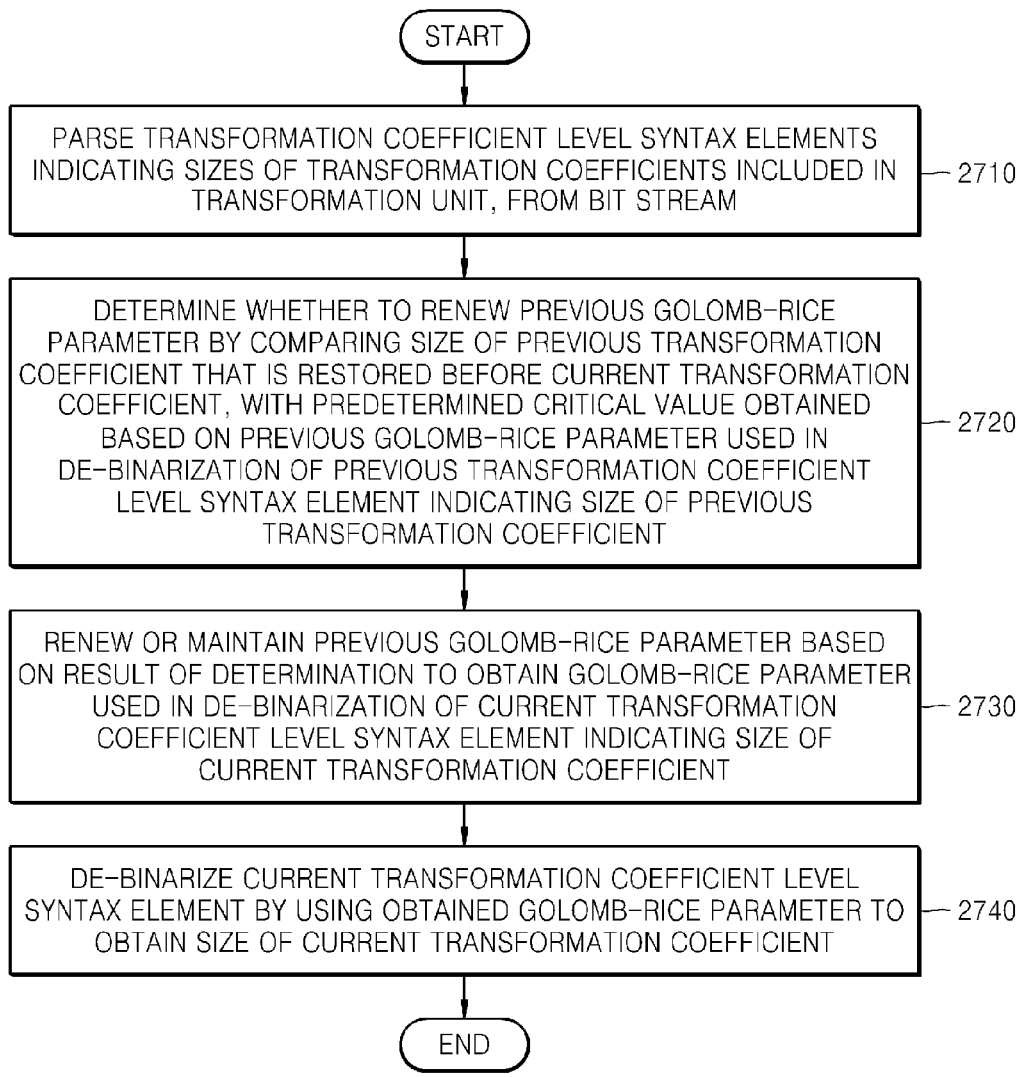
FIG. 27 is a flowchart illustrating a method of entropy decoding of a transformation coefficient level according to an exemplary embodiment.

FIG. 27 is a flowchart illustrating a method of entropy decoding of a transformation coefficient level according to an exemplary embodiment.

Referring to FIG. 27, in operation 2710, transformation coefficient level syntax elements included in a transformation unit are parsed from a bit stream. The parsed transformation coefficient level syntax elements are bit strings that each consist of bit values such as one or zero.

In operation 2720, the parameter determiner 2610 compares a size of a previous transformation coefficient (cLastAbsCoeff) that is restored before a current transformation coefficient, with a predetermined critical value obtained based on a previous parameter (cLastRiceParam) used in de-binarization of a previous transformation coefficient level syntax element to determine whether to renew the previous parameter (cLastRiceParam).

In operation 2730, the parameter determiner 2610 renews or maintains the previous parameter (cLastRiceParam) based on a result of the determination in 2720 to obtain a parameter (cRiceParam) used in de-binarization of a transformation coefficient level syntax element (coeff_abs_level_remaining). As described above, the parameter determiner 2610 compares a critical value th obtained based on the equation: th=3*(1<<cLastRiceParam) with the previous parameter cLastRiceParam. When cLastAbsCoeff is greater than th, the parameter determiner 2610 renews the previous parameter (cLastRiceParam) by increasing the same by 1. However, when cLastAbsCoeff is not greater than th, the parameter determiner 2610 does not renew but maintains the previous parameter. When the parameter is renewed, the renewed parameter is gradually increased by +1.

In operation 2740, the syntax element restorer 2620 de-binarizes the current transformation coefficient level syntax element using the obtained parameter to obtain size information of the current transformation coefficient. As described above, as coeff_abs_level_remaining=absCoeff-baseLevel, coeff_abs_level_greather1_flag and coeff_abs_level_greather2_flag are restored in addition to coeff_abs_level_remaining. When a basic level value baseLevel is determined according to the equation: baseLevel=1+coeff_abs_level_greather1_flag+coeff_abs_level_greather2flag, the size of the current transformation coefficient may be determined according to the equation: absCoeff=coeff_abs_level_remaining+baseLevel.

The invention can also be embodied as computer readable codes on a non-transitory computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, etc. The computer readable recording medium can also be distributed over network coupled computer systems so that the computer readable code is stored and executed in a distributed fashion.

While exemplary embodiments have been particularly shown and described with reference to exemplary embodiments thereof, it will be understood by those of ordinary skill in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

The invention claimed is:

1. An apparatus of decoding video, the apparatus comprising:
   a parser which obtains a bin string corresponding to current transformation coefficient level information by arithmetic decoding a bitstream;
   a parameter determiner which determines a current binarization parameter, for determining a prefix bin string from the bin string, to be one of (i) a previous binarization parameter and (ii) an updated value of the previous binarization parameter obtained by adding n to the previous binarization parameter, where n is integer, and n is equal to or greater than 1, based on a comparison between a predetermined value that is proportional to the previous binarization parameter and a value of a previous transformation coefficient;
   a syntax element restorer which obtains the current transformation coefficient level information by de-binarizing a binary value of the prefix bin string using the determined current binarization parameter, and which determines a value of the current transformation coefficient using the current transformation coefficient level information; and
   a decoder which decodes data included in a transformation unit using inverse quantization, and reverse transformation based on the value of the current transformation coefficient:
   wherein, when the value of the previous transformation coefficient is equal to or smaller than the predetermined value, the current binarization parameter is determined to be the previous binarization parameter, and
   when the value of the previous transformation coefficient is larger than the predetermined value, the current binarization parameter is determined to be the updated value.

* * * * *